US010256300B2

United States Patent
Natsume et al.

(10) Patent No.: US 10,256,300 B2
(45) Date of Patent: Apr. 9, 2019

(54) SEMICONDUCTOR DEVICE

(71) Applicant: Panasonic Intellectual Property Management Co., Ltd., Osaka (JP)

(72) Inventors: Shinya Natsume, Toyama (JP); Masaki Inoue, Osaka (JP); Mitsuo Tanaka, Fukui (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 15/913,290

(22) Filed: Mar. 6, 2018

(65) Prior Publication Data

US 2018/0197950 A1    Jul. 12, 2018

Related U.S. Application Data

(63) Continuation of application No. PCT/JP2017/006107, filed on Feb. 20, 2017.

(30) Foreign Application Priority Data

Jul. 28, 2016   (JP) ................. 2016-148791

(51) Int. Cl.
*H01L 29/06* (2006.01)
*H01L 21/762* (2006.01)
(Continued)

(52) U.S. Cl.
CPC ...... *H01L 29/0649* (2013.01); *H01L 21/3205* (2013.01); *H01L 21/76* (2013.01);
(Continued)

(58) Field of Classification Search
CPC ......... H01L 21/76264; H01L 21/76283; H01L 21/76289; H01L 27/1203; H01L 29/0649
See application file for complete search history.

(56) References Cited

U.S. PATENT DOCUMENTS 6,432,753 B1    8/2002   Abesingha et al.
2002/0182780 A1*  12/2002  Abesingha ............ H01L 23/562
                                                  438/127
(Continued)

FOREIGN PATENT DOCUMENTS

JP    S61-251157 A    11/1986
JP    H03-073558 A     3/1991
(Continued)

OTHER PUBLICATIONS

International Search Report issued in Application No. PCT/JP2017/006107 dated Mar. 21, 2017, with English translation.

*Primary Examiner* — Ermias T Woldegeorgis
(74) *Attorney, Agent, or Firm* — McDermott Will & Emery LLP

(57) ABSTRACT

A semiconductor device includes: an active layer that is located in an SOI substrate, and in which an element included in a circuit is formed; a buried insulation layer that is located in the SOI substrate, and is in contact with the active layer; a deep trench isolation (DTI) region that is formed in the active layer to surround a whole formation region of the element in plan view, and extends from an upper surface to a lower surface of the active layer; and a first conductive film formed above the element. The DTI region has a first hole inside, and a film thickness of the first conductive film is greater than a thickness of the active layer.

21 Claims, 15 Drawing Sheets

(51) Int. Cl.
*H01L 21/822* (2006.01)
*H01L 21/8222* (2006.01)
*H01L 23/29* (2006.01)
*H01L 23/31* (2006.01)
*H01L 21/3205* (2006.01)
*H01L 23/522* (2006.01)
*H01L 21/76* (2006.01)
*H01L 21/768* (2006.01)
*H01L 27/04* (2006.01)
*H01L 27/06* (2006.01)
*H01L 21/764* (2006.01)
*H01L 23/00* (2006.01)
*H01L 27/12* (2006.01)
*H01L 29/73* (2006.01)
*H01L 29/735* (2006.01)

(52) U.S. Cl.
CPC .......... *H01L 21/762* (2013.01); *H01L 21/764* (2013.01); *H01L 21/768* (2013.01); *H01L 21/76224* (2013.01); *H01L 21/76264* (2013.01); *H01L 21/76283* (2013.01); *H01L 21/76289* (2013.01); *H01L 21/822* (2013.01); *H01L 21/8222* (2013.01); *H01L 23/29* (2013.01); *H01L 23/31* (2013.01); *H01L 23/522* (2013.01); *H01L 23/5226* (2013.01); *H01L 23/562* (2013.01); *H01L 27/04* (2013.01); *H01L 27/06* (2013.01); *H01L 23/3157* (2013.01); *H01L 27/1203* (2013.01); *H01L 29/0653* (2013.01); *H01L 29/735* (2013.01); *H01L 29/7317* (2013.01)

(56) References Cited

U.S. PATENT DOCUMENTS

| | | | |
|---|---|---|---|
| 2009/0008750 | A1 | 1/2009 | Tokitoh |
| 2009/0108409 | A1 | 4/2009 | Tsutsue |
| 2010/0148218 | A1 | 6/2010 | Yokoyama |
| 2011/0175205 | A1 | 7/2011 | Morii et al. |
| 2013/0105935 | A1 | 5/2013 | Yokoyama |
| 2015/0061038 | A1 | 3/2015 | Takewaki et al. |
| 2015/0270394 | A1 | 9/2015 | Takewaki et al. |
| 2016/0197095 | A1 * | 7/2016 | Yamane .................... G05F 1/56 257/506 |

FOREIGN PATENT DOCUMENTS

| | | | | |
|---|---|---|---|---|
| JP | 2006-049828 A | 2/2006 | | |
| JP | 2006-135069 A | 5/2006 | | |
| JP | 2006-339406 A | 12/2006 | | |
| JP | 2007-180363 A | 7/2007 | | |
| JP | 2008-187076 A | 8/2008 | | |
| JP | 2009-016542 A | 1/2009 | | |
| JP | 2009-076782 A | 4/2009 | | |
| JP | 2009-105269 A | 5/2009 | | |
| JP | 2011-151121 A | 8/2011 | | |
| JP | 2013-222838 A | 10/2013 | | |
| JP | 2014-060263 A | 4/2014 | | |
| JP | 2015-046468 A | 3/2015 | | |
| JP | WO 2015037166 A1 * | 3/2015 | ............... | G05F 1/56 |
| WO | 2010/067481 A1 | 6/2010 | | |
| WO | 2015/037166 A1 | 3/2015 | | |

* cited by examiner

SEMICONDUCTOR DEVICE

CROSS REFERENCE TO RELATED APPLICATIONS

This application is a U.S. continuation application of PCT International Patent Application Number PCT/JP2017/006107 filed on Feb. 20, 2017, claiming the benefit of priority of Japanese Patent Application Number 2016-148791 filed on Jul. 28, 2016, the entire contents of which are hereby incorporated by reference.

BACKGROUND

1. Technical Field

The present disclosure relates to a semiconductor device, in particular a semiconductor device that includes a semiconductor chip in which a high-accuracy analog circuit is formed and that is made by resin molding, and a method of manufacturing the same.

2. Description of the Related Art

With growing popularity of hybrid vehicles and electric vehicles in recent years, batteries for driving motors as their power sources have been in heavy use. In living environments other than vehicles, too, batteries have been increasingly used as storage batteries and the like.

It is important to recognize the battery capacity of such a battery, and therefore an IC for constantly monitoring battery voltage with high accuracy is indispensable. Such a battery monitoring IC includes a reference voltage generation circuit that generates constant voltage. Suppressing fluctuation of this circuit contributes to more accurate voltage measurement.

Hence, silicon on insulator (SOI) has been employed for semiconductor substrates in recent years, to improve the temperature characteristics of the transistors in the reference voltage generation circuit as a basic circuit to thus increase accuracy.

For example, Japanese Unexamined Patent Application Publication No. 2014-60263 proposes a structure of stacking, above and below a semiconductor chip in which a high-accuracy analog circuit is formed, a semiconductor chip having the same thermal expansion coefficient. This structure is intended to, in a semiconductor device made by resin-molding a semiconductor chip in which an analog circuit is formed, suppress fluctuation in the characteristics of the analog circuit caused by thermal stress.

The specification of U.S. Pat. No. 6,432,753 proposes a structure of forming, above a high-accuracy analog circuit, a thick metal coating film as a stress relaxation layer. This structure is intended to relax stress on the analog circuit.

SUMMARY

In the structure disclosed in Japanese Unexamined Patent Application Publication No. 2014-60263, a semiconductor chip having the same thermal expansion coefficient is stacked above and below a semiconductor chip in which a high-accuracy analog circuit is formed. As a result, the stress applied to the semiconductor chip when subjected to temperature fluctuation becomes uniform on both upper and lower sides of the semiconductor chip, so that fluctuation in the characteristics of the analog circuit due to temperature can be reduced. However, this structure is not very effective in relaxing the stress of the resin package itself. Since the upper and lower semiconductor chips are stacked above and below the semiconductor chip in which the analog circuit is formed, the strain of the upper and lower semiconductor chips is directly applied to the semiconductor chip in which the analog circuit is formed. The effect of suppressing the strain of the semiconductor chip caused by package resin and the relaxation of the strain due to long-term use is therefore poor. Besides, this structure requires at least three semiconductor chips, which causes not only increases in the number of substrates, diffusion cost, and assembly cost, but also decreases in assembly yield and reliability because of many inter-chip connections. Moreover, to seal the thickness of three chips, the thickness of the package resin needs to be increased. Thicker resin causes greater stress from the package, and so the stress relaxation effect by placing the upper and lower semiconductor chips is canceled out.

In the structure disclosed in U.S. Pat. No. 6,432,753, a thick metal coating film is formed above a high-accuracy analog circuit, as a stress relaxation layer. This structure has the effect of relaxing the stress on the upper side of the analog circuit but clearly does not have the effect of relaxing the stress on the lower side of the analog circuit when subjected to temperature fluctuation. Since the stress due to temperature fluctuation is not uniform on the upper and lower sides, significant stress acts on the semiconductor chip and the semiconductor chip is strained. Regarding the stress of the package itself, too, the structure is effective in relaxing the stress on the upper side of the analog circuit but cannot relax the stress on the lower side of the analog circuit. The structure as a whole cannot sufficiently relax significant stress from the semiconductor package, so that the semiconductor chip itself is strained and warps.

In view of the above, the present disclosure provides a semiconductor device that can relax stress on an analog circuit to suppress fluctuation in characteristics caused by temperature fluctuation or resin sealing and ensure the stability of the characteristics of the analog circuit with high accuracy over a long period of time, without increasing costs or manufacturing steps.

A semiconductor device according to one aspect of the present disclosure is a semiconductor device including: a semiconductor chip that has a silicon on insulator (SOI) substrate carrying a circuit; and a resin mold that seals the semiconductor chip, the semiconductor device including: an active layer that is located in the SOI substrate, and in which an element included in the circuit is formed; a buried insulation layer that is located in the SOI substrate, and is in contact with the active layer; a deep trench isolation (DTI) region that is formed in the active layer to surround a whole of a formation region of the element in plan view, and extends from a surface of the active layer to the buried insulation layer; and a first conductive film formed above the element, wherein the DTI region has a first hole inside, and a film thickness of the first conductive film is greater than a thickness of the active layer.

The first hole may include at least one cavity formed in the DTI region along a shape of the DTI region in plan view, and surround the formation region of the element in plan view.

The first conductive film may have a shape covering at least the whole of the formation region of the element in plan view, or a shape surrounding the whole of the formation region of the element in plan view.

The semiconductor device may further include: a first interlayer insulation film formed between the active layer and the first conductive film; and a seal ring that passes through the first interlayer insulation film and is in contact with the active layer and the first conductive film, wherein the seal ring surrounds a whole of the element in plan view.

The seal ring may include: two or more layers of wiring formed in the first interlayer insulation film; and a conductive film connecting the two or more layers of wiring to each other.

The semiconductor device may further include: a second conductive film formed in a same layer as the first conductive film, to surround a whole of the first conductive film in plan view; and a protection film (e.g. an insulation film) filling a gap between the first conductive film and the second conductive film, wherein the protection film has a second hole between the first conductive film and the second conductive film.

The second hole may include at least one cavity formed between the first conductive film and the second conductive film along an outer shape of the first conductive film in plan view, and surround the first conductive film in plan view.

A vertical dimension of the second hole may be greater than a vertical dimension of the first hole in side view.

The second conductive film may have a third hole inside.

The third hole may include at least one cavity formed in the second conductive film along a shape of the second conductive film in plan view, and surround the second hole in plan view.

The semiconductor device may further include: a second conductive film formed in a same layer as the first conductive film, above the element, wherein a film thickness of the second conductive film is greater than the thickness of the active layer.

The semiconductor device may further include: a protection film (e.g. an insulation film) filling a gap between the first conductive film and the second conductive film, wherein the protection film has a second hole between the first conductive film and the second conductive film, and a vertical dimension of the second hole is greater than a vertical dimension of the first hole in side view.

The first conductive film may be formed to surround the whole of the formation region of the element in plan view.

The first conductive film may have a second hole inside.

The first conductive film may be formed to surround the whole of the formation region of the element in plan view, and the second hole may include at least one cavity formed in the first conductive film along a shape of the first conductive film in plan view, and surround the formation region of the element in plan view.

The first hole may be a vacuum, or be filled with a gas or with a material lower in Young's modulus than the active layer.

The second hole may be a vacuum, or be filled with a gas or with a material lower in Young's modulus than the active layer.

The third hole may be a vacuum, or be filled with a gas or with a material lower in Young's modulus than the active layer.

The element may include at least one of a transistor, a diode, a resistor, an analog circuit, a reference voltage generation circuit, a current mirror circuit, and a differential amplifier.

A semiconductor device manufacturing method according to one aspect of the present disclosure is a method of manufacturing a semiconductor device including: a semiconductor chip that has a silicon on insulator (SOI) substrate carrying a circuit; and a resin mold that seals the semiconductor chip, the method including: preparing the SOI substrate including an active layer and a buried insulation layer; forming an element included in the circuit, in the active layer; forming a groove that passes through the active layer to surround a whole formation region of the element; forming a first insulation film on the active layer and, before the groove portion is completely filled with the first insulation film, blocking the groove portion to form a first hole in the groove portion; and forming a first conductive layer greater in film thickness than the active layer, above the active layer.

The semiconductor device and the manufacturing method according to the present disclosure can relax stress on an analog circuit to suppress fluctuation in characteristics caused by temperature fluctuation or resin sealing and ensure the stability of the characteristics of the analog circuit with high accuracy over a long period of time, without increasing costs or manufacturing steps.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

DETAILED DESCRIPTION OF THE EMBODIMENTS (Circumstances Leading to Attainment of an Aspect of the Present Disclosure)

The inventors of the present disclosure have found the following problem with the semiconductor device described in the Description of the Related Art.

First, a reference voltage generation circuit using an SOI substrate is described below, as a comparative example.

Figure 10:
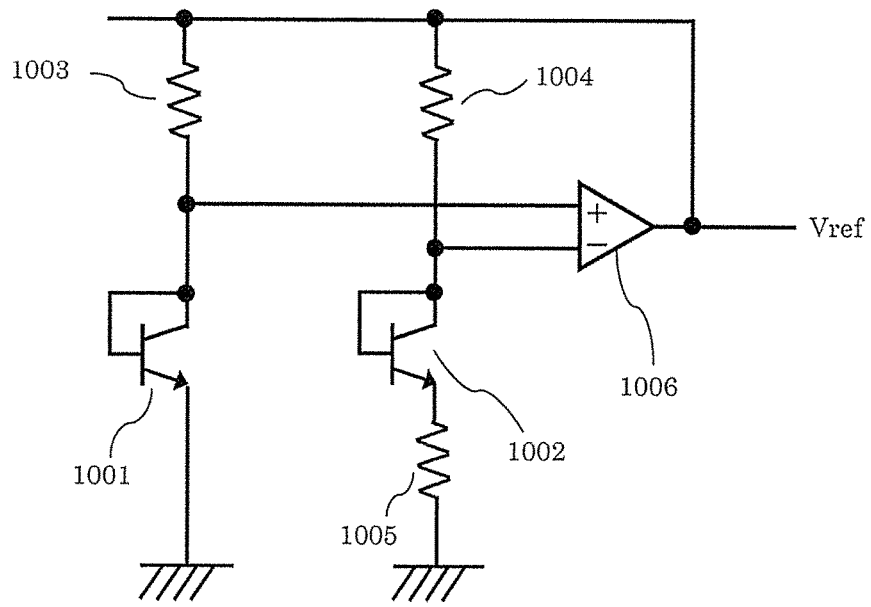
FIG. 10 is a diagram illustrating an example of the structure of a bandgap reference circuit which is a reference voltage generation circuit according to a comparative example.

FIG. 10 is a diagram illustrating an example of the structure of a bandgap reference circuit which is a reference voltage generation circuit according to the comparative example.

In the drawing, the output of operational amplifier 1006 is connected to a series-connected circuit of resistor 1003 and NPN bipolar transistor 1001 and a series-connected circuit of resistor 1004, NPN bipolar transistor 1002, and resistor 1005, which are connected in parallel. Resistor 1003 is connected to the collector and base of NPN bipolar transistor 1001. Resistor 1004 is connected to the collector and base of NPN bipolar transistor 1002. The emitter of NPN bipolar transistor 1001 is grounded. The emitter of NPN bipolar transistor 1002 is connected to resistor 1005. The other end of resistor 1005 is grounded.

NPN bipolar transistor 1001 and NPN bipolar transistor 1002 are actually composed of a plurality of transistors connected in parallel. The ratio of the number of transistors constituting NPN bipolar transistor 1001 and the number of transistors constituting NPN bipolar transistor 1002 is 1:K (K is a natural number). The value of K, the resistance values of resistors 1003, 1004, and 1005, the circuit structure of the operational amplifier, and the like are optimized according to the load, power voltage, and process specifications of the bandgap reference circuit. The bandgap reference circuit is a circuit that generates constant voltage not depending on ambient temperature, and extracts the temperature characteristics of the PN diode junction by the circuit and outputs the bandgap voltage of silicon (approximately 1.2 V) from the output terminal as reference voltage Vref. Since fluctuation in output voltage with ambient temperature can be suppressed by optimizing the circuit parameters, the bandgap reference circuit is included in a semiconductor device to generate reference voltage for a constant voltage generation circuit or a constant current generation circuit.

Figure 11:
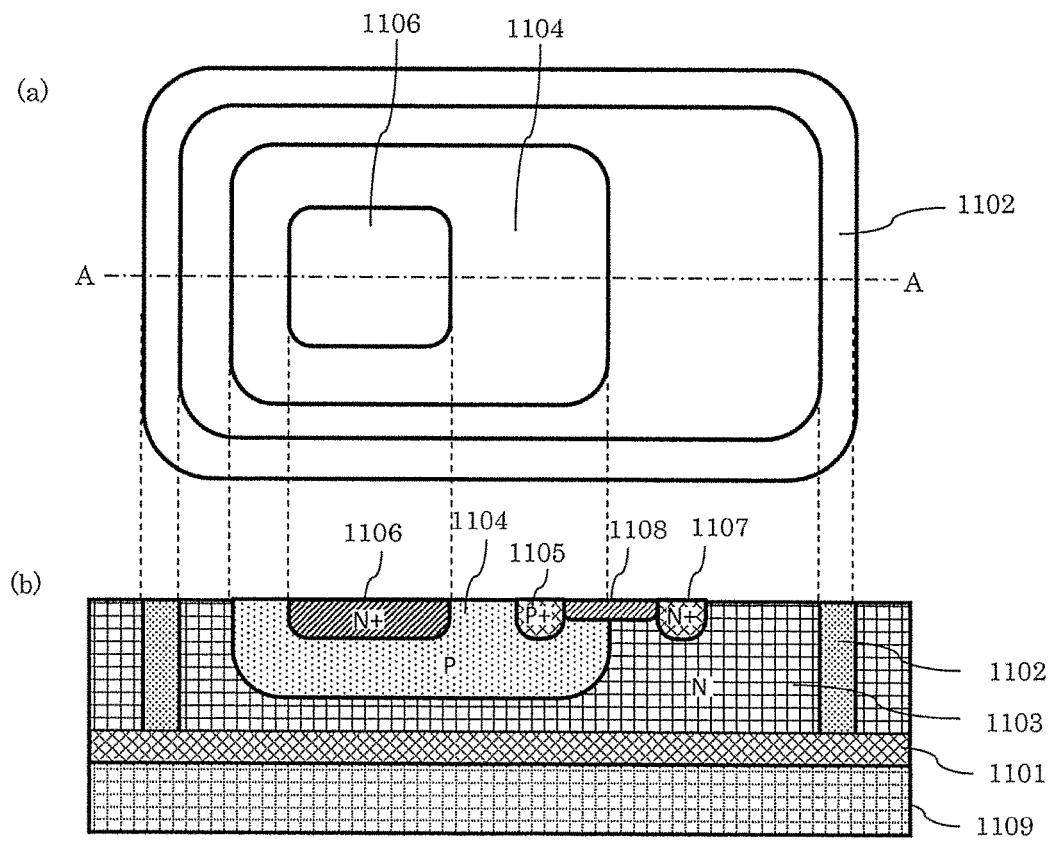
FIG. 11 is a perspective plan view and a sectional view illustrating a semiconductor chip according to the comparative example.

As NPN bipolar transistor 1001 or 1002, a semiconductor chip having a structure illustrated in FIG. 11 is used as an example. FIG. 11 is a perspective plan view and a sectional view illustrating the semiconductor chip according to the comparative example.

(a) in FIG. 11 is a perspective plan view of part of the semiconductor chip. (b) in FIG. 11 is a sectional view along line A-A in (a) in FIG. 11. The structure in FIG. 11 corresponds to one of the plurality of transistors constituting NPN bipolar transistor 1002 or to NPN bipolar transistor 1001 in FIG. 10. In the structure in FIG. 11, the NPN bipolar transistor is electrically separated completely from its surroundings, by buried insulation layer 1101 and insulation oxide film 1102 in a silicon substrate. N-type layer 1103 as the collector is situated in the element region of the separated NPN bipolar transistor. P-type layer 1104 as the base is formed in N-type layer 1103. Dense P-type layer 1105 is formed in P-type layer 1104, as the base contact. Dense N-type layer 1106 is formed in P-type layer 1104, as the emitter. Dense N-type layer 1107 is formed in N-type layer 1103, as the collector contact. Shallow trench isolation (STI) 1108 is formed between dense P-type layer 1105 as the base contact and dense N-type layer 1107 as the collector contact.

By completely separating the element in such a structure, no leakage current to support substrate 1109 occurs, with it being possible to improve accuracy and reliability. Particularly when the device is used in a high-temperature environment such as in-vehicle, leakage current can be significant, and so it is important to increase the accuracy of temperature characteristics by employing the SOI substrate.

Figure 12:
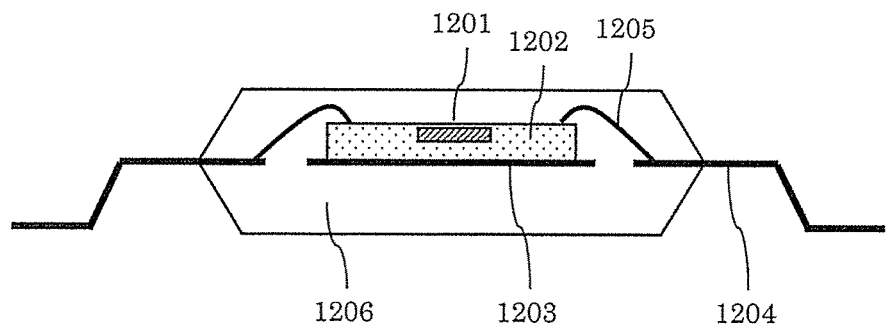
FIG. 12 is a sectional view illustrating a semiconductor device in a package state according to the comparative example.

Meanwhile, a semiconductor chip is resin-sealed in a semiconductor package for implementation and moisture resistance attainment, and used as a semiconductor device having a structure illustrated in FIG. 12. FIG. 12 is a sectional view illustrating the semiconductor device in the package state according to the comparative example. Bandgap reference circuit 1201 in FIG. 12 corresponds to the reference voltage generation circuit in FIG. 10. As illustrated in FIG. 12, semiconductor chip 1202 in which bandgap reference circuit 1201 is formed is bonded onto island 1203 of a lead frame made of a copper alloy, via a silver paste material. Each electrode on the upper surface of semiconductor chip 1202 and lead terminal 1204 of the lead frame are connected by bonding wire 1205 of gold, copper, or the like. Semiconductor chip 1202 is sealed with resin mold 1206 made of epoxy resin.

In the semiconductor device of the structure illustrated in FIG. 12, when temperature fluctuation occurs, thermal stress acts on the upper side of semiconductor chip 1202 due to the difference in thermal expansion coefficient between semiconductor chip 1202 and resin mold 1206. Moreover, thermal stress different from that on the upper side acts on the lower side of semiconductor chip 1202 due to the difference in thermal expansion coefficient between semiconductor chip 1202 and island 1203 of the lead frame. Thus, the thermal stress acting on the upper and lower surfaces of semiconductor chip 1202 is not uniform. This induces significant stress on semiconductor chip 1202, and causes semiconductor chip 1202 to be strained. When stress acts on the silicon substrate constituting semiconductor chip 1202, resistance fluctuation called a piezoresistance effect takes place due to the strain of silicon crystal, and the characteristics of the NPN bipolar transistors and resistors constituting the bandgap reference circuit fluctuate. As a result, the circuit parameters deviate from the optimized characteristics, leading to the problem in that the deviation of reference voltage Vref of the bandgap reference circuit and the fluctuation of reference voltage Vref with temperature increase. To solve this problem, for example, Japanese Unexamined Patent Application Publication No. 2014-60263 proposes a structure of stacking, above and below a semiconductor chip in which a high-accuracy analog circuit is formed, a semiconductor chip having the same thermal expansion coefficient.

Figure 13:
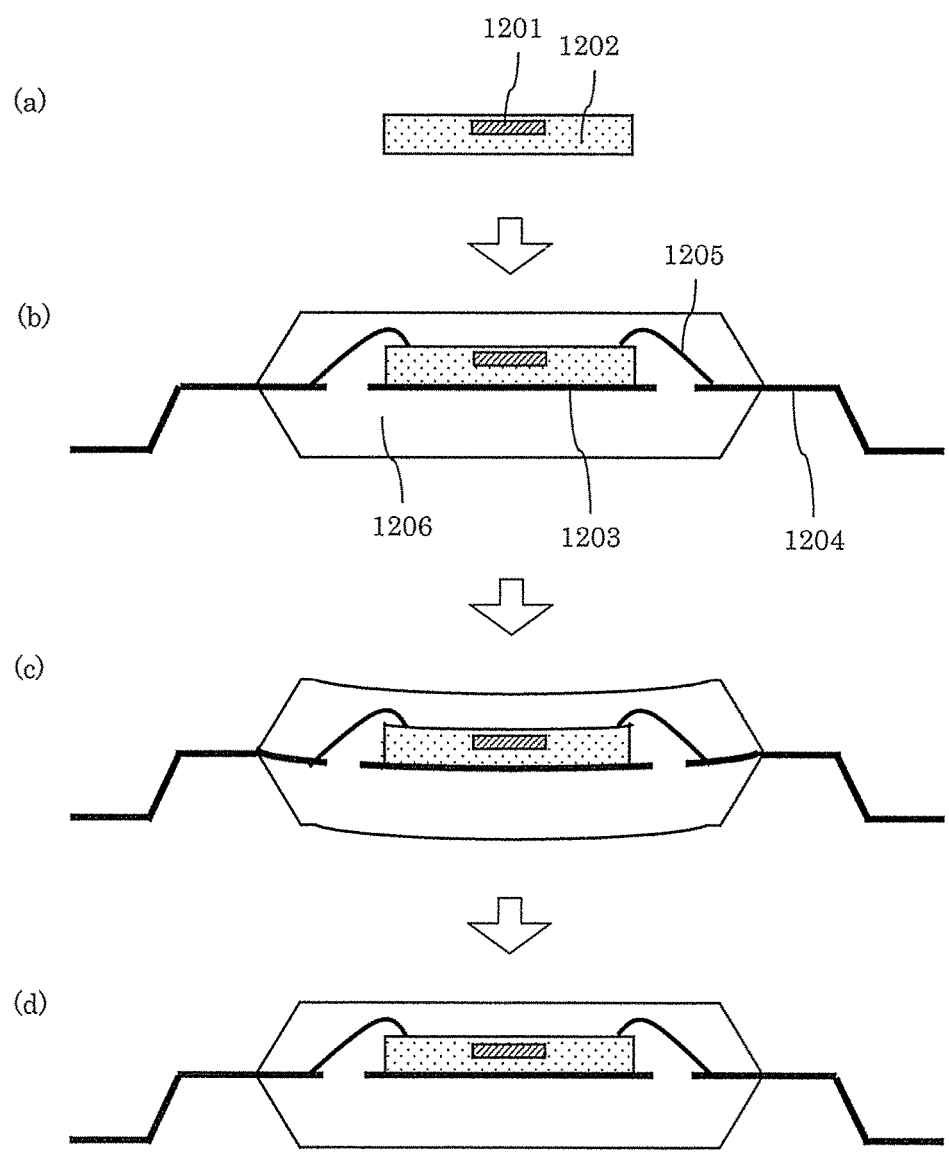
FIG. 13 is an explanatory diagram illustrating package stress in the semiconductor device according to the comparative example.

The influence of the stress of the resin package itself is described below, with reference to FIG. 13. FIG. 13 is an explanatory diagram relating to the package stress of the semiconductor device according to the comparative example. (a) in FIG. 13 illustrates semiconductor chip 1202 before resin sealing. This semiconductor chip 1202 is subjected to no external stress. (b) in FIG. 13 illustrates the semiconductor device after semiconductor chip 1202 is sealed with resin mold 1206. Semiconductor chip 1202 is mounted on island 1203 of the lead frame. Here, semiconductor chip 1202 is subjected to stress in the direction in which semiconductor chip 1202 is compressed, from resin mold 1206. Due to this stress from resin mold 1206, semiconductor chip 1202 is strained and warps. (c) in FIG. 13 illustrates the change of the semiconductor device caused by stress immediately after reflow of the semiconductor device, in an exaggerated manner to facilitate understanding. Resin mold 1206 is further hardened and compressed through the agency of heat applied by reflow. This further increases the strain of semiconductor chip 1202. As mentioned earlier, when stress acts on the silicon substrate constituting semiconductor chip 1202, resistance fluctuation called a piezoresistance effect takes place due to the strain of silicon crystal, and the characteristics of the NPN bipolar transistors, diodes, and resistors constituting the bandgap reference circuit fluctuate. As a result, the circuit parameters deviate from the optimized characteristics, leading to the problem in that the deviation of the reference voltage of the bandgap reference circuit and the fluctuation of reference voltage Vref with temperature increase. To solve this problem, U.S. Pat. No. 6,432,753 proposes a structure of forming, above a high-accuracy analog circuit, a thick metal coating film as a stress relaxation layer.

However, as a result of closely investigating the characteristics of the analog element and the like, the inventors of the present disclosure have found, as a new problem not solvable by the measures described in the Description of the Related Art, that the temporal change of stress by the resin constituting the package significantly influences the long-term stability of the reference voltage generation circuit.

(d) in FIG. 13 illustrates the shape of the semiconductor device that has been used for, for example, 10 years after the reflow of the semiconductor device in (c) in FIG. 13. Resin mold 1206 once hardened as a result of the reflow in (c) in FIG. 13 is, with the passage of time or repeated temperature fluctuation, released from hardening, and approaches the state in (d) in FIG. 13 after resin sealing. Thus, the strain caused by stress is gradually relieved (relaxed). This leads to the problem in that the circuit parameters gradually fluctuate from the optimized characteristics over long-term use to the product's life, and the deviation of reference voltage Vref and the fluctuation of reference voltage Vref with temperature are unstable in the long term.

The fluctuation in characteristics in (c) in FIG. 13 can be corrected to some extent by, for example, a trimming mechanism. The long-term fluctuation in characteristics in (d) in FIG. 13 is, however, not correctable by a trimming mechanism. Besides, since the strain is opposite in direction to that upon resin sealing, it is difficult to provide beforehand such a mechanism that compensates for the fluctuation in characteristics caused by the package.

In the structure disclosed in Japanese Unexamined Patent Application Publication No. 2014.60263, a semiconductor chip having the same thermal expansion coefficient is stacked above and below a semiconductor chip in which a high-accuracy analog circuit is formed. As a result, the stress applied to the semiconductor chip when subjected to temperature fluctuation becomes uniform on both upper and lower sides of the semiconductor chip, so that fluctuation in the characteristics of the analog circuit due to temperature can be reduced. However, this structure is not very effective in relaxing the stress of the resin package itself. Since the upper and lower semiconductor chips are stacked above and below the semiconductor chip in which the analog circuit is formed, the strain of the upper and lower semiconductor chips is directly applied to the semiconductor chip in which the analog circuit is formed. The effect of suppressing the strain of the semiconductor chip caused by package resin and the relaxation of the strain due to long-term use is therefore poor. Besides, this structure requires at least three semiconductor chips, which causes not only increases in the number of substrates, diffusion cost, and assembly cost, but also decreases in assembly yield and reliability because of many inter-chip connections. Moreover, to seal the thickness of three chips, the thickness of the package resin needs to be increased. Thicker resin causes greater stress from the package, and so the stress relaxation effect by placing the upper and lower semiconductor chips is canceled out.

In the structure disclosed in U.S. Pat. No. 6,432,753, a thick metal stress relaxation layer is formed above a high-accuracy analog circuit. This structure has the effect of relaxing the stress on the upper side of the analog circuit but clearly does not have the effect of relaxing the stress on the lower side of the analog circuit when subjected to temperature fluctuation. Since the stress due to temperature fluctuation is not uniform on the upper and lower sides, significant stress acts on the semiconductor chip and the semiconductor chip is strained. Regarding the stress of the package itself, too, the structure is effective in relaxing the stress on the upper side of the analog circuit but cannot relax the stress on the lower side of the analog circuit. The structure as a whole cannot sufficiently relax significant stress from the semiconductor package, so that the semiconductor chip itself is strained and warps.

In view of the above, the present disclosure provides a semiconductor device that can relax stress on an analog circuit to suppress fluctuation in characteristics caused by temperature fluctuation or resin sealing and ensure the stability of the characteristics of the analog circuit with high accuracy over a long period of time, without increasing costs or manufacturing steps.

Embodiments are described below, with reference to drawings. In the following, detailed description of well-known matters or repeated description of the substantially same structures may be omitted. This is to avoid unnecessarily redundant description and facilitate the understanding of a person skilled in the art.

The accompanying drawings and the following description are provided as an example to help a person skilled in the art to fully understand the present disclosure, and are not intended to limit the subject matter defined in the appended claims.

Embodiment 1

Figure 1:
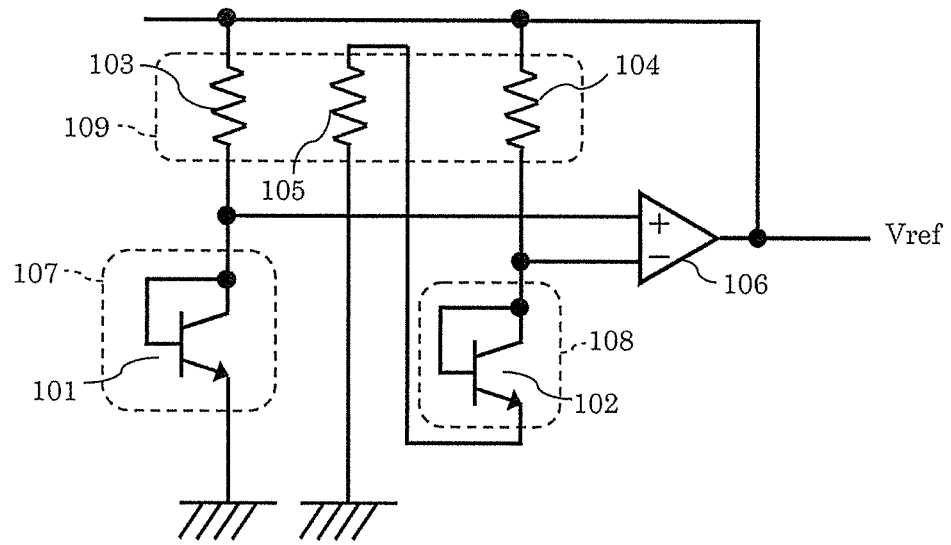
FIG. 1 is a diagram illustrating an example of a bandgap reference circuit which is a reference voltage generation circuit included in a semiconductor device according to Embodiment 1.
Figure 2:
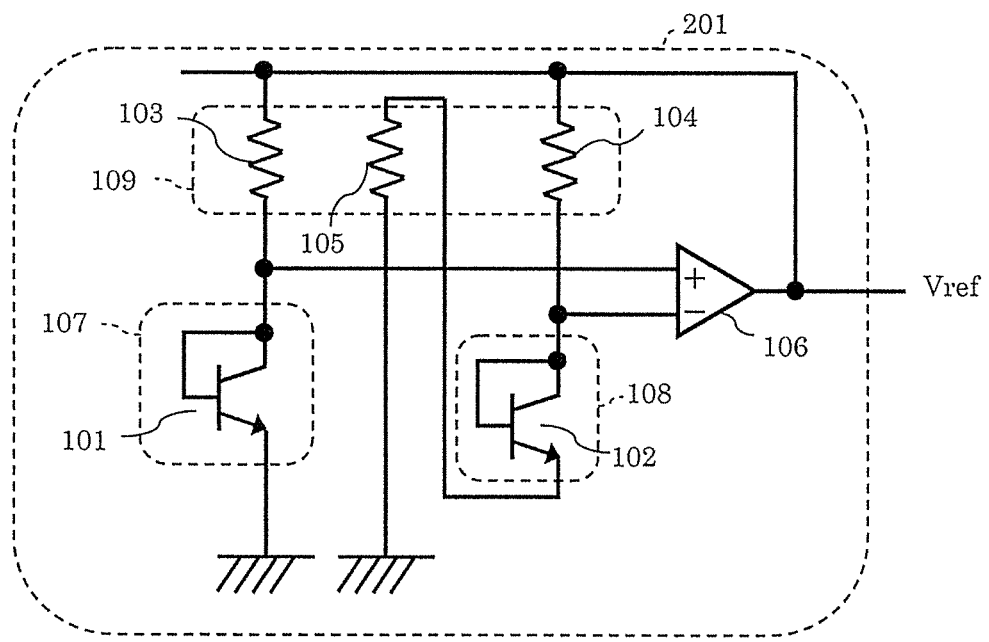
FIG. 2 is a diagram illustrating a variation of the bandgap reference circuit included in the semiconductor device according to Embodiment 1.
Figure 3:
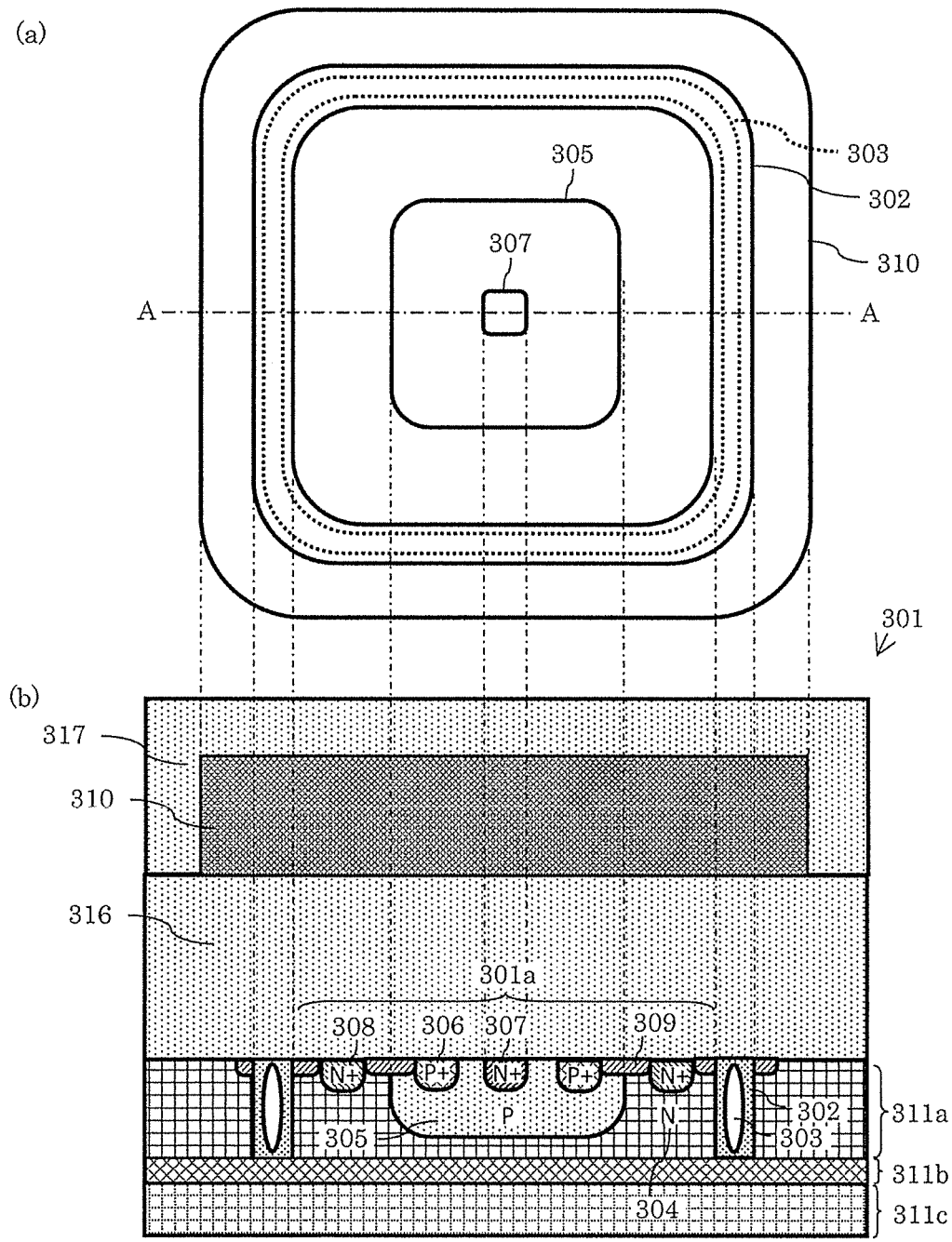
FIG. 3 is a perspective plan view and a sectional view illustrating a semiconductor chip included in the semiconductor device according to Embodiment 1.

FIG. 1 is a diagram illustrating an example of a bandgap reference circuit which is a reference voltage generation circuit included in semiconductor device 300 according to Embodiment 1. FIG. 2 is a diagram illustrating a variation of the bandgap reference circuit included in semiconductor device 300 according to Embodiment 1. FIG. 3 is a perspective plan view and a sectional view illustrating semiconductor chip 301 included in semiconductor device 300 according to Embodiment 1. FIG. 3 does not illustrate all elements constituting the circuit, but illustrates NPN bipolar transistor 301a as an example of an element included in the circuit. NPN bipolar transistor 301a is an example of an element included in the reference voltage generation circuit in FIG. 1 or 2, and corresponds to one of a plurality of transistors constituting NPN bipolar transistor 101, one of a plurality of transistors constituting NPN bipolar transistor 102, NPN bipolar transistor 102, or NPN bipolar transistor 101.

In FIGS. 1 and 2, the output of operational amplifier 106 is connected to a series-connected circuit of resistor 103 and NPN bipolar transistor 101 and a series-connected circuit of resistor 104, NPN bipolar transistor 102, and resistor 105, which are connected in parallel. Resistor 103 is connected to the collector and base of NPN bipolar transistor 101. Resistor 104 is connected to the collector and base of NPN bipolar transistor 102. The emitter of NPN bipolar transistor 101 is grounded. The emitter of NPN bipolar transistor 102 is connected to one end of resistor 105. The other end of resistor 105 is grounded.

NPN bipolar transistor 101 and NPN bipolar transistor 102 are actually composed of a plurality of transistors connected in parallel. The ratio of the number of transistors constituting NPN bipolar transistor 101 and the number of transistors constituting NPN bipolar transistor 102 is 1:K. The value of K, the resistance values of resistors 103, 104, and 105, the circuit structure of operational amplifier 106, and the like are optimized according to the load, power voltage, and process specifications of the bandgap reference circuit. The bandgap reference circuit is a circuit that generates constant voltage not depending on ambient temperature, and extracts the temperature characteristics of the PN diode junction by the circuit and outputs the bandgap voltage of silicon (approximately 1.2 V) from the output terminal as reference voltage Vref. Since fluctuation in output voltage with ambient temperature can be suppressed by optimizing the circuit parameters, the bandgap reference circuit is included in a semiconductor integrated circuit device to generate reference voltage.

NPN bipolar transistor 101 is surrounded with insulation oxide film 107, and covered with a first conductive film from directly above. The first conductive film corresponds to first conductive film 310 in FIG. 3. Insulation oxide film 107 in FIGS. 1 and 2 corresponds to deep trench isolation (DTI) region 302 in plan view in FIG. 3, or DTI region 302, buried insulation layer 311b, and first interlayer insulation film 316 in side view in FIG. 3.

Likewise, NPN bipolar transistor 102 or one of the plurality of transistors constituting NPN bipolar transistor 102 is surrounded with insulation oxide film 108, and covered with the first conductive film from directly above. The first conductive film corresponds to first conductive film 310 in FIG. 3. Insulation oxide film 108 in FIGS. 1 and 2 corresponds to DTI region 302 in plan view in FIG. 3, or DTI region 302, buried insulation layer 311b, and first interlayer insulation film 316 in side view in FIG. 3.

Resistors 103, 104, and 105 are surrounded with insulation oxide film 109, and covered with the first conductive film from directly above. The first conductive film corresponds to first conductive film 310 in FIG. 3. Insulation oxide film 109 in FIGS. 1 and 2 has the same structure as DTI region 302 in plan view in FIG. 3, or has the same structure as DTI region 302, buried insulation layer 311b, and first interlayer insulation film 316 in side view in FIG. 3.

The elements such as NPN bipolar transistors 101 and 102 and resistors 103, 104, and 105 may be each individually surrounded with DTI region 302 and covered with the conductive film from directly above.

Alternatively, the plurality of elements may altogether be surrounded with the insulation oxide film and covered with the conductive film from directly above. The whole group of elements constituting the bandgap reference circuit may altogether be surrounded with the insulation oxide film and covered with the conductive film from directly above.

As illustrated in FIG. 2, a multiple structure in which each element is individually surrounded with the insulation oxide film and the whole bandgap reference circuit is surrounded with insulation oxide film 201 may be used, with the whole bandgap reference circuit being covered with the conductive film from above. This conductive film has the same structure as first conductive film 310 in FIG. 3. Insulation oxide film 201 in FIG. 2 has the same structure as DTI region 302 in plan view in FIG. 3, or has the same structure as DTI region 302, buried insulation layer 311b, and first interlayer insulation film 316 in side view in FIG. 3.

Semiconductor chip 301 illustrated in FIG. 3 is part of the bandgap reference circuit. FIG. 3 illustrates NPN bipolar transistor 301a which is an example of an element included in the circuit and its surroundings. (a) in FIG. 3 is a perspective plan view of the part including NPN bipolar transistor 301a. (b) in FIG. 3 is a sectional view along line A-A in (a) in FIG. 3.

As illustrated in FIG. 3, semiconductor chip 301 includes active layer 311a, buried insulation layer 311b, and support substrate 311c included in an SOI substrate, and first interlayer insulation film 316 and protection film 317 (which may be an upper-layer insulation film in the case of an uppermost layer, or a second interlayer insulation film in the case of an intermediate layer). Active layer 311a includes the formation region of the element (NPN bipolar transistor 301a in this example) included in the circuit, and its surroundings.

NPN bipolar transistor 301a is separated completely from its surrounding region, by buried insulation layer 311b and DTI region 302 which is an insulation oxide film having a trench (DTI: Deep Trench Isolation) structure in the SOI substrate. DTI region 302 is formed in active layer 311a to surround the whole formation region of the element (NPN bipolar transistor 301a in the example in FIG. 3) in plan view, and to extend from the surface of active layer 311a to buried insulation layer 311b.

First conductive film 310 is formed above the element. First conductive film 310 has a shape that covers at least the whole formation region of the element in plan view. First conductive film 310 may have a shape that surrounds the whole formation region of the element in plan view.

DTI region 302 has first hole 303 inside. First hole 303 includes at least one cavity formed in DTI region 302 along the shape of DTI region 302 in plan view, and surrounds the formation region of the element in plan view. In the example in (a) in FIG. 3, first hole 303 is made up of one cavity having a doughnut shape, more accurately, a rounded rectangular shape. First hole 303 is not limited to the shape in (a) in FIG. 3, and may be made up of a plurality of cavities. First hole 303 may be a vacuum, or be filled with a gas or with a material that has a different composition from the semiconductor substrate and is lower in Young's modulus than the semiconductor substrate.

N-type layer 304 as the collector is situated in the separated element. P-type layer 305 as the base is formed in N-type layer 304. Dense P-type layer 306 as the base contact is formed in P-type layer 305. Dense N-type layer 307 as the emitter is formed in P-type layer 305. Dense N-type layer 308 as the collector contact is formed in N-type layer 304 away from P-type layer 305. Shallow trench isolation (STI) 309 is formed across the boundary between the surface of N-type layer 304 and the surface of P-type layer 305. First conductive film 310 whose film thickness is greater than the thickness of active layer 311a in the semiconductor substrate is provided directly above NPN bipolar transistor 301a, and covers at least the whole upper part of NPN bipolar transistor 301a in plan view. Although first conductive film 310 covers the whole upper part of NPN bipolar transistor 301a in plan view, first conductive film 310 may be partially absent within the range in which the below-mentioned effects are ensured.

The mechanism for reducing the influence of the stress of the package on NPN bipolar transistor 301a by such a structure is described below.

First, when temperature fluctuation occurs, the thermal stress acting on the upper side of semiconductor chip 301 can be relaxed by first conductive film 310, and the thermal stress acting on the lower side of semiconductor chip 301 can be relaxed by first hole 303 in DTI region 302. The non-uniformity of thermal stress acting separately on the upper and lower sides of semiconductor chip 301 can thus be reduced to reduce the strain of semiconductor chip 301. This prevents fluctuation in the characteristics of NPN bipolar transistor 301a included in the bandgap circuit.

The same effects can also be achieved in the case where the element having the problem of fluctuation in characteristics is any of resistors 103, 104, and 105 in FIG. 1.

Hence, the circuit parameters do not deviate from the optimized characteristics, so that the deviation of reference voltage Vref of the bandgap reference circuit and the fluctuation of reference voltage Vref with temperature can be suppressed.

The inventors of the present disclosure have confirmed that the insulation oxide film formed by DTI region 302 having first hole 303 has a greater stress relaxation effect than the stress relaxation film such as first conductive film 310, and that the reduction of the non-uniformity of thermal stress applied to the upper and lower sides of semiconductor chip 301 can be achieved by making the film thickness of first conductive film 310 greater than the film thickness of active layer 311a in which DTI region 302 having first hole 303 is formed.

Regarding the stress by the surrounding package resin when semiconductor chip 301 is buried in the package, too, the stress acting on the upper side of semiconductor chip 301 can be relaxed by first conductive film 310, and the stress acting on the lower side of semiconductor chip 301 can be relaxed by first hole 303 in DTI region 302.

Figure 4:
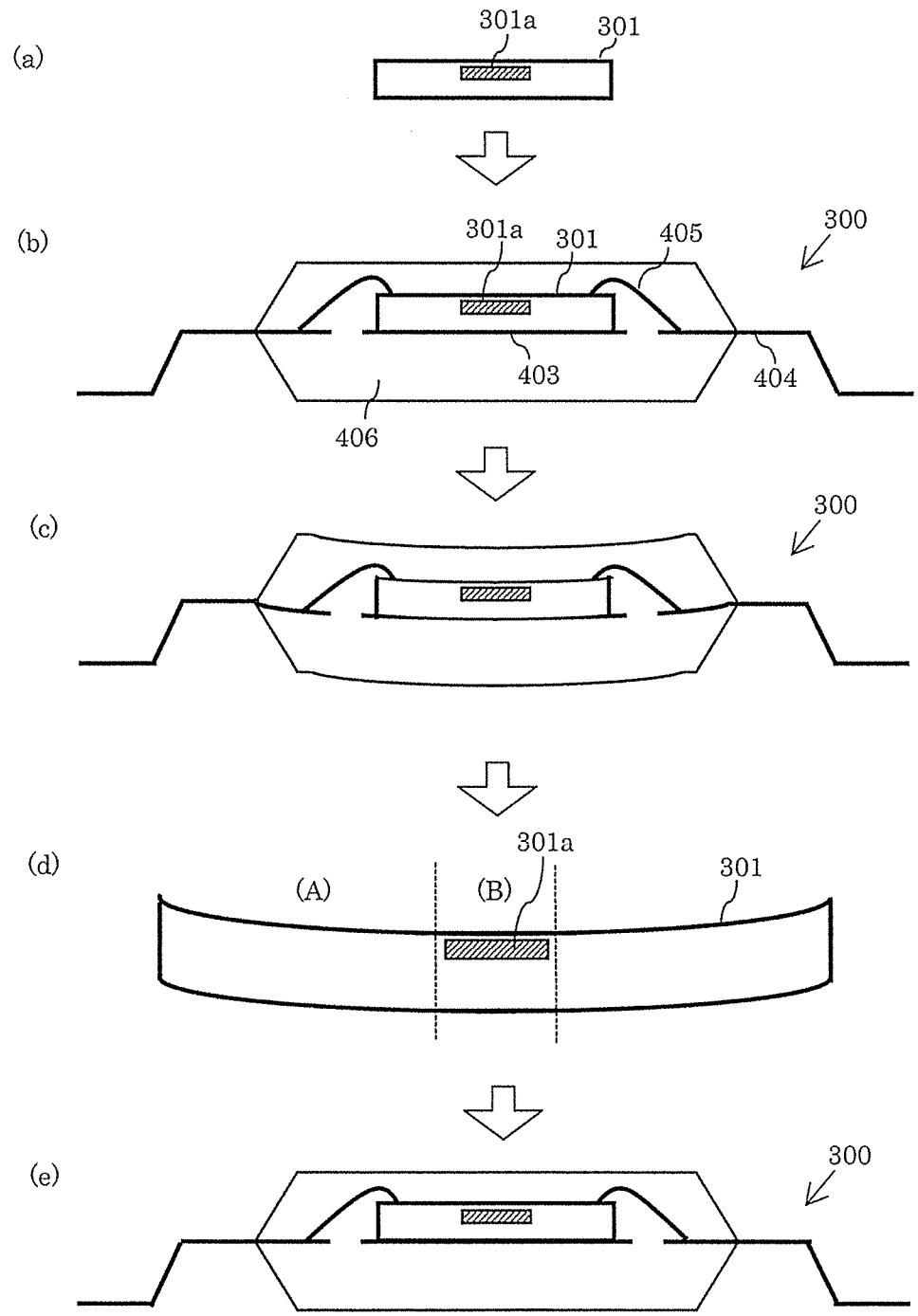
FIG. 4 is an explanatory diagram illustrating the effect of relaxing package stress in the semiconductor device according to Embodiment 1.

FIG. 4 is an explanatory diagram illustrating the effect of relaxing the stress of the package itself in semiconductor device 300 according to Embodiment 1. (d) in FIG. 4 is an enlarged view of semiconductor chip 301 which is illustrated in an exaggerated manner to facilitate understanding of the state of semiconductor chip 301 after reflow. As illustrated in (a) to (c) in FIG. 4, semiconductor chip 301 is strained and warps due to the stress of package resin, as in FIG. 13. In (d) in FIG. 4 in this embodiment, region (A) is a region where first conductive film 310 and first hole 303 in DTI region 302 are not provided in plan view, and region (B) is a region where first conductive film 310, first hole 303 in DTI region 302, and NPN bipolar transistor 301a are provided in plan view. In region (A), warpage occurs as in FIG. 13. In region (B), on the other hand, the stress is relaxed and warpage is reduced.

In terms of the package, the strain of the region where NPN bipolar transistor 301a is formed can be reduced after reflow. Accordingly, even when stress relaxation of package resin occurs over the long term, the strain in the formation region of NPN bipolar transistor 301a fluctuates little, so that long-term stability can be ensured.

As described above, semiconductor device 300 according to this embodiment is semiconductor device 300 including: semiconductor chip 301 that has a silicon on insulator (SOI) substrate carrying a circuit; and resin mold 406 that seals semiconductor chip 301, semiconductor device 300 including: active layer 311a that is located in the SOI substrate, and in which an element (e.g. NPN bipolar transistor 301a) included in the circuit is formed; buried insulation layer 311b that is located in the SOI substrate, and is in contact with active layer 311a; DTI region 302 that is formed in active layer 311a to surround a whole of a formation region of the element in plan view, and extends from a surface of active layer 311a to buried insulation layer 311b; and first conductive film 310 formed above the element. DTI region 302 has first hole 303 inside, and a film thickness of first conductive film 310 is greater than a thickness of active layer 311a.

Such a structure can relax stress on an analog circuit to suppress fluctuation in characteristics caused by temperature fluctuation or resin sealing and ensure the stability of the characteristics of the analog circuit with high accuracy over a long period of time, without increasing costs or manufacturing steps.

First hole 303 may include at least one cavity formed in DTI region 302 along a shape of DTI region 302 in plan view, and surround the formation region of the element in plan view.

First conductive film 310 may have a shape covering at least the whole of the formation region of the element in plan view, or a shape surrounding the whole of the formation region of the element in plan view.

First hole 303 may be a vacuum, or be filled with a gas or with a material lower in Young's modulus than active layer 311a.

The element may include at least one of a transistor, a diode, a resistor, an analog circuit, a reference voltage generation circuit, a current mirror circuit, and a differential amplifier.

Variation of Embodiment 1

Figure 5:
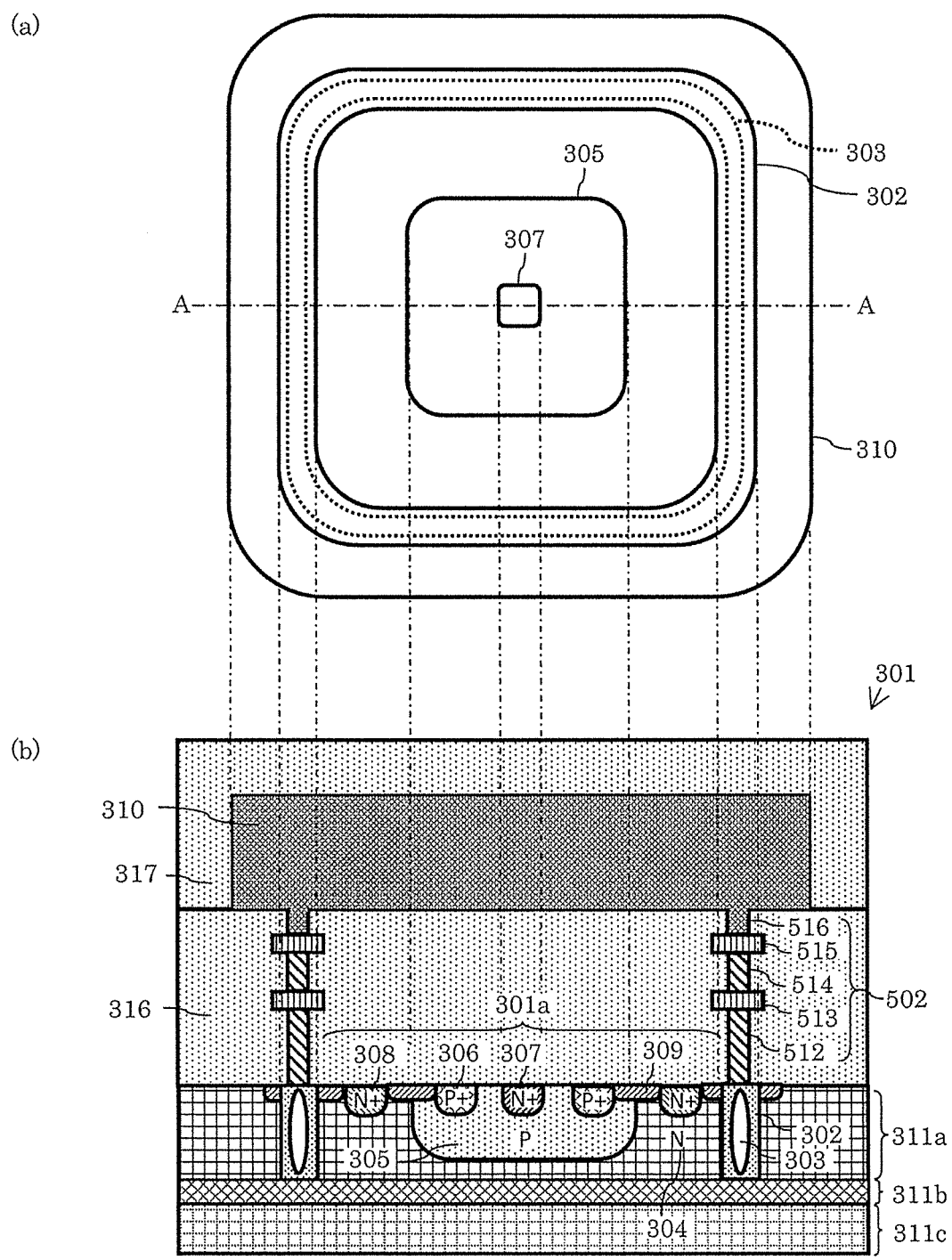
FIG. 5 is a perspective plan view and a sectional view illustrating a semiconductor chip included in a semiconductor device according to a variation of Embodiment 1.

FIG. 5 is a perspective plan view and a sectional view illustrating a semiconductor chip included in semiconductor device 300 according to a variation of Embodiment 1.

(a) in FIG. 5 is a perspective plan view of part of semiconductor device 300. (b) in FIG. 5 is a sectional view along line A-A in (a) in FIG. 5.

Semiconductor chip 301 in FIG. 5 differs from that in FIG. 3 in that seal ring 502 is added in first interlayer insulation film 316. The differences are mainly described below.

Protection film 317 and first interlayer insulation film 316 are both insulation films. Protection film 317 also serves as a protection film for protecting semiconductor chip 301.

First interlayer insulation film 316 is an insulation film formed between active layer 311a and first conductive film 310.

Seal ring 502 is formed in first interlayer insulation film 316 to surround NPN bipolar transistor 301a in plan view. Seal ring 502 may pass through first interlayer insulation film 316 and be in contact with active layer 311a and first conductive film 310. Seal ring 502 includes two or more layers of wiring 513 and 515 formed in first interlayer insulation film 316, and connection conductive films 512, 514, and 516 connected to the wiring.

The upper surface of wiring 515 is in contact with first conductive film 310. Connection conductive film 512, wiring 513, connection conductive film 514, and wiring 515 form a seal ring structure. DTI region 302 and connection conductive film 512 may not be in contact with each other.

At least wirings 513 and 515 are each wiring in any of the wiring layers in a multilayer wiring structure, and are formed to surround NPN bipolar transistor 301a in plan view. Connection conductive films 512 and 514 are in contact with wirings 513 and 515 adjacent above and below, and are in groove shape (wiring shape) surrounding whole NPN bipolar transistor 301a in plan view. Alternatively, connection conductive films 512 and 514 may be in via shape in contact with wirings 513 and 515. The stress relaxation effect is greater when connection conductive films 512 and 514 are in continuous wiring shape. In the case where connection conductive film 512, wiring 513, connection conductive film 514, and wiring 515 are all in wiring shape, a structure in which seal ring 502 has openings only in parts where circuit wiring connected to the element passes may be used.

Thus, in this variation, seal ring 502 having a stack structure connects lower active layer 311a and upper first conductive film 310, to surround the whole upper part of NPN bipolar transistor 301a.

With such a structure, in addition to the relaxation effect described in Embodiment 1, the support effect by the structure of a plurality of stacked conductive films in contact with active layer 311a and first conductive film 310 further reduces the strain in region (B) where the element is formed as illustrated in (d) in FIG. 4.

This support effect is maximized when the bottom of the support by seal ring 502 is located between the element (e.g. NPN bipolar transistor 301a) and DTI region 302. With such arrangement, first conductive film 310 and the support of seal ring 502 are prevented from being strained by stress, while first hole 303 in DTI region 302 is under strain to thus relax the stress on the outer side of the support of seal ring 502.

As a variation, a structure in which the support of seal ring 502 surrounds the element in a multiple fashion or a structure in which DTI region 302 surrounds the element in a multiple fashion has a greater effect, but increases the chip size. Accordingly, an appropriate structure may be selected based on the required stress relaxation level and the number of semiconductor chips 301 acquired per wafer.

As described above, semiconductor device 300 according to this variation further includes: first interlayer insulation film 316 formed between active layer 311a and first conductive film 310; and seal ring 502 that passes through first interlayer insulation film 316 and is in contact with active layer 311a and first conductive film 310, wherein seal ring 502 surrounds a whole of the element in plan view.

With such a structure, the strain in the element formation region of semiconductor chip 301 can be further reduced by the support effect.

Seal ring 502 may include: two or more layers of wiring 513 and 515 formed in first interlayer insulation film 316; and a conductive film (e.g. connection conductive film 514) connecting two or more layers of wiring 513 and 515 to each other.

Embodiment 2

Figure 6:
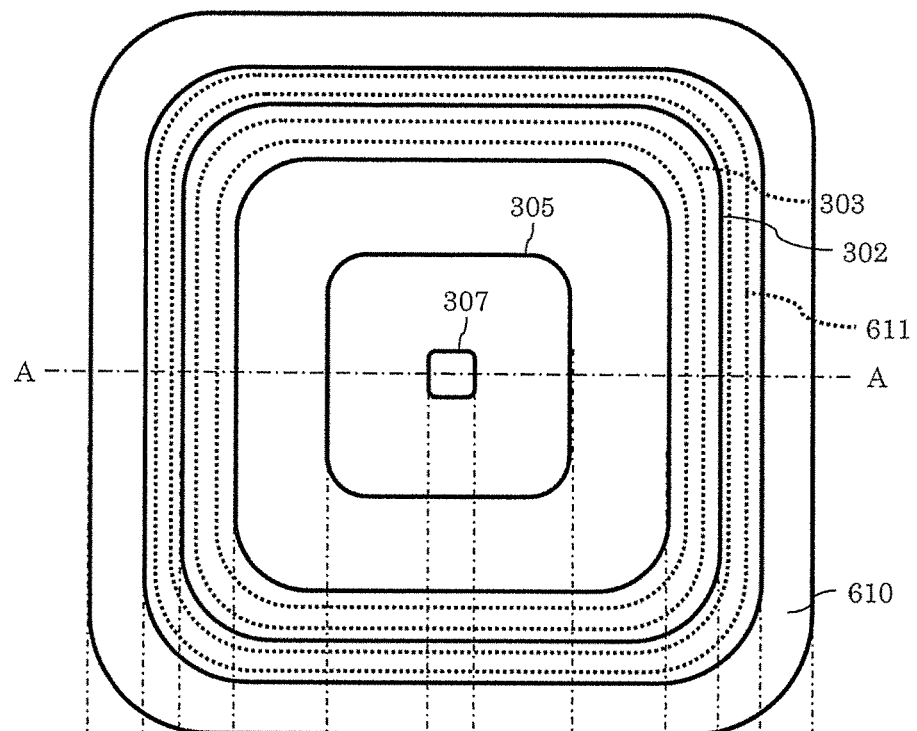
FIG. 6 is a perspective plan view and a sectional view illustrating a semiconductor chip included in a semiconductor device according to Embodiment 2.
Figure 6:
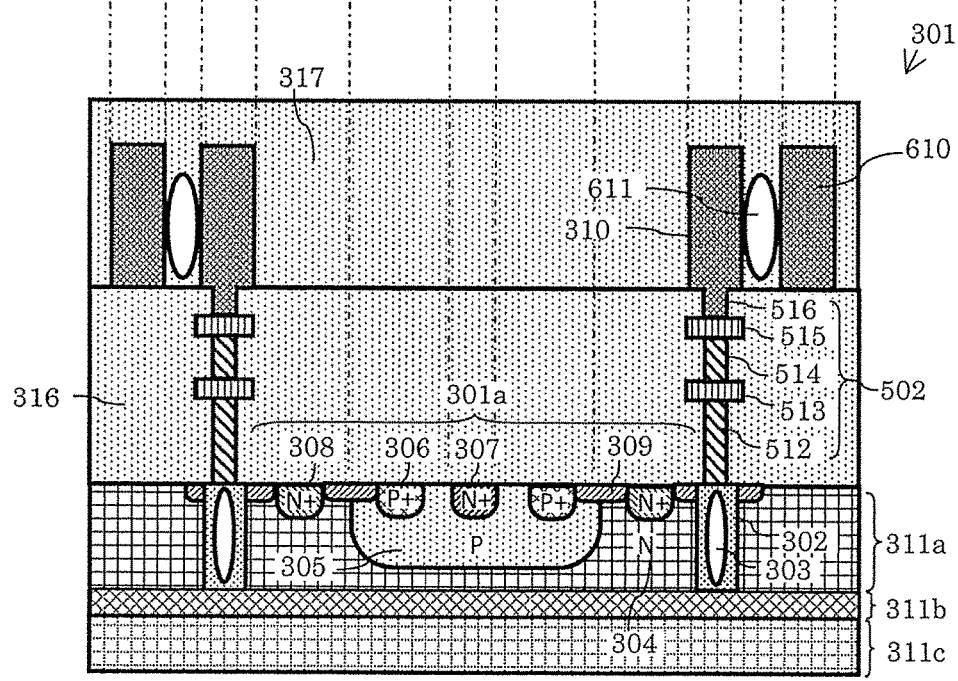

FIG. 6 is a perspective plan view and a sectional view illustrating semiconductor chip 301 included in semiconductor device 300 according to Embodiment 2.

(a) in FIG. 6 is a perspective plan view of part of the semiconductor chip. (b) in FIG. 6 is a sectional view along line A-A in (a) in FIG. 6.

Semiconductor chip 301 in FIG. 6 differs from that in FIG. 5 in the shapes of first conductive film 310 and protection film 317, the addition of second conductive film 610, and the addition of second hole 611. The differences are mainly described below.

First conductive film 310 has a shape that surrounds the whole formation region of the element (NPN bipolar transistor 301a in this example) in plan view.

Protection film 317 has a shape that covers first conductive film 310, second conductive film 610, and second hole 611.

Second conductive film 610 is formed in the same layer as first conductive film 310, to surround whole first conductive film 310 in plan view.

Protection film 317 has second hole 611 between first conductive film 310 and second conductive film 610.

Semiconductor chip 301 in this embodiment has two or more wiring members including first conductive film 310 and second conductive film 610, which form a multiple ring structure of two or more rings located above and surrounding NPN bipolar transistor 301a. These wiring members are, however, not limited to ring shape, and may be arranged randomly above NPN bipolar transistor 301a.

Protection film 317 filling the gap between the conductive films of the multiple ring structure has second hole 611. Second hole 611 may be a vacuum, or be filled with a gas or with a material that has a different composition from the semiconductor substrate and is lower in Young's modulus than the semiconductor substrate.

The thickness of second conductive film 610 is greater than the film thickness of active layer 311a in the semiconductor substrate.

The mechanism for reducing the influence of the stress of the package of semiconductor device 300 on NPN bipolar transistor 301a by such a structure is described below.

First, when temperature fluctuation occurs, the thermal stress acting on the upper side of semiconductor chip 301 can be relaxed by second hole 611, and the thermal stress acting on the lower side of semiconductor chip 301 can be relaxed by first hole 303 in DTI region 302. The non-uniformity of thermal stress acting separately on the upper and lower sides of semiconductor chip 301 can thus be reduced to reduce the strain of semiconductor chip 301. This prevents fluctuation in the characteristics of NPN bipolar transistor 301a included in the bandgap reference circuit. The same effects can also be achieved in the case where the element having the problem of fluctuation in characteristics is any of resistors 103, 104, and 105.

Hence, the circuit parameters do not deviate from the optimized characteristics, so that the deviation of reference voltage Vref of the bandgap reference circuit and the fluctuation of reference voltage Vref with temperature can be suppressed.

The inventors of the present disclosure have confirmed that the reduction of the non-uniformity of thermal stress applied to the upper and lower sides of semiconductor chip 301 can be easily achieved by making the film thickness of second conductive film 610 greater than the film thickness of active layer 311a in which DTI region 302 having first hole 303 is formed to thus make second hole 611 greater than first hole 303.

Regarding the stress by the surrounding package resin when semiconductor chip 301 is buried in the package, too, the stress acting on the upper side of semiconductor chip 301 can be relaxed by second hole 611, and the stress acting on the lower side of semiconductor chip 301 can be relaxed by first hole 303 in DTI region 302.

To reduce the strain in the region where NPN bipolar transistor 301a is formed, second hole 611 may be located outside NPN bipolar transistor 301a in plan view, and also may have a multiple structure.

Second hole 611 is not an essential structural element. Any insulation film having a high stress relaxation effect as protection film 317 filling the gap between first conductive film 310 and second conductive film 610 may be selected to produce the same effect as second hole 611.

As described above, semiconductor device 300 according to this embodiment further includes: second conductive film 610 formed in a same layer as first conductive film 310, to surround a whole of first conductive film 310 in plan view; and protection film 317 filling a gap between first conductive film 310 and second conductive film 610, wherein protection film 317 has second hole 611 between first conductive film 310 and second conductive film 610.

With such a structure, regarding the stress by the surrounding package resin when semiconductor chip 301 is packaged, the stress acting on the upper side of semiconductor chip 301 can be relaxed by second hole 611, and the stress acting on the lower side of semiconductor chip 301 can be relaxed by first hole 303 in DTI region 302. The strain in the element formation region of semiconductor chip 301 can be further reduced in this way.

Second hole 611 may include at least one cavity formed between first conductive film 310 and second conductive film 610 along an outer shape of first conductive film 310 in plan view, and surround first conductive film 310 in plan view.

A vertical dimension of second hole 611 may be greater than a vertical dimension of first hole 303 in side view.

Semiconductor device 300 according to this embodiment further includes: second conductive film 610 formed in a same layer as first conductive film 310, above the element, wherein a film thickness of second conductive film 610 is greater than the thickness of active layer 311a.

Semiconductor device 300 may further include: protection film 317 filling a gap between first conductive film 310 and second conductive film 610, wherein protection film 317 has second hole 611 between first conductive film 310 and second conductive film 610, and a vertical dimension of second hole 611 is greater than a vertical dimension of first hole 303 in side view.

First conductive film 310 may be formed to surround the whole of the formation region of the element in plan view.

Second hole 611 may be a vacuum, or be filled with a gas or with a material lower in Young's modulus than the active layer.

Embodiment 3

Figure 7:
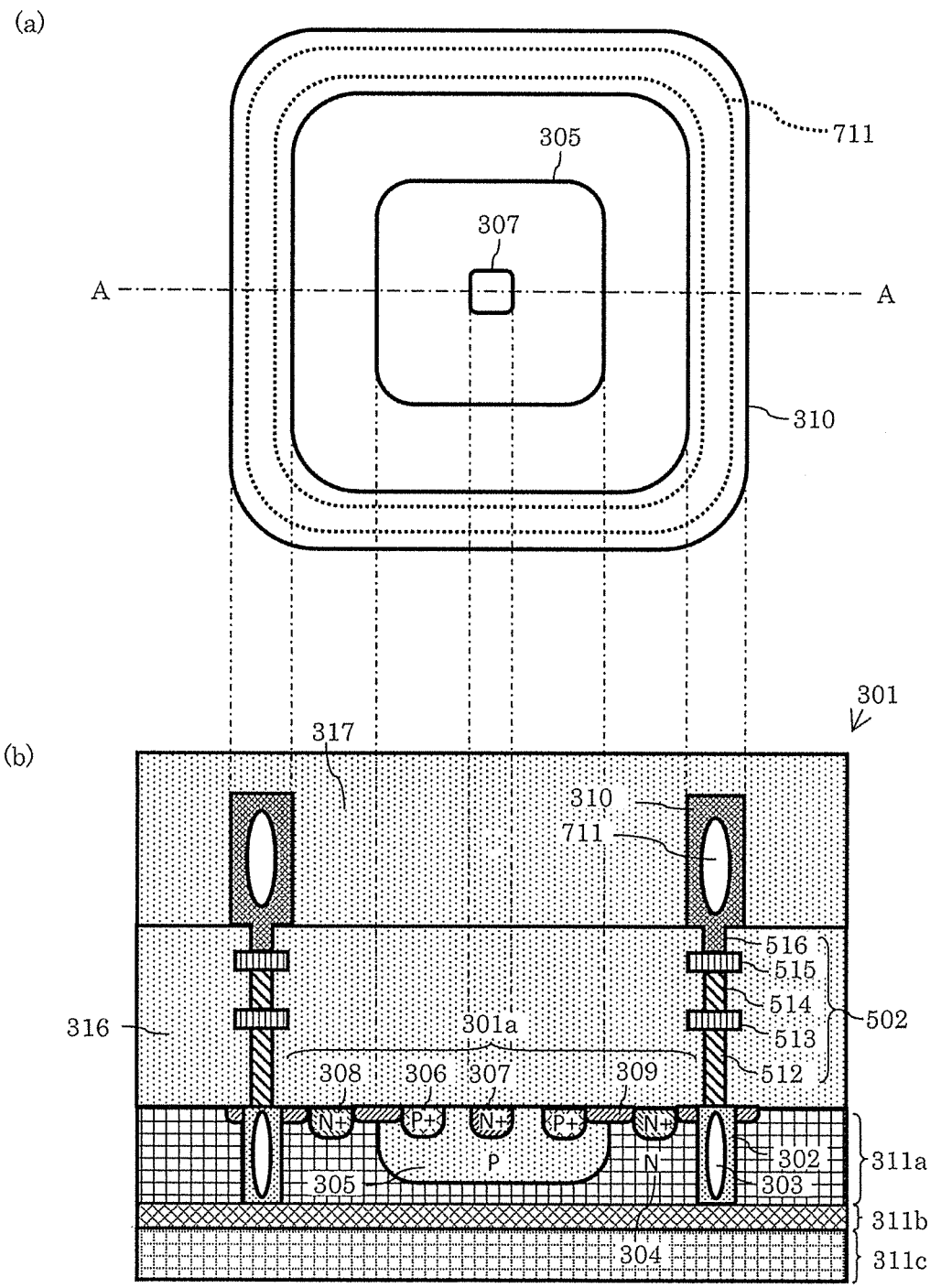
FIG. 7 is a perspective plan view and a sectional view illustrating a semiconductor chip included in a semiconductor device according to Embodiment 3.

FIG. 7 is a perspective plan view and a sectional view illustrating semiconductor chip 301 included in semiconductor device 300 according to Embodiment 3.

(a) in FIG. 7 is a perspective plan view of part of semiconductor chip 301. (b) in FIG. 7 is a sectional view along line A-A in (a) in FIG. 7.

Semiconductor chip 301 in FIG. 7 differs from that in FIG. 5 in the shape of first conductive film 310 and the addition of second hole 711 in first conductive film 310. The differences are mainly described below.

First conductive film 310 has a ring shape that surrounds the whole formation region of the element (NPN bipolar transistor 301a in this example) in plan view. First conductive film 310 is, however, not limited to ring shape, and may be arranged randomly above NPN bipolar transistor 301a.

First conductive film 310 has second hole 711 inside. Second hole 711 includes at least one cavity formed in first conductive film 310 along the shape of first conductive film 310 in plan view, and surrounds the formation region of the element in plan view. Second hole 711 may be a vacuum, or be filled with a gas or with a material that has a different composition from the semiconductor substrate and is lower in Young's modulus than the semiconductor substrate.

The thickness of first conductive film 310 is greater than the thickness of active layer 311a.

The mechanism for reducing the influence of the stress of the package of semiconductor device 300 on NPN bipolar transistor 301a by such a structure is described below.

First, when temperature fluctuation occurs, the thermal stress acting on the upper side of semiconductor chip 301 can be relaxed by second hole 711, and the thermal stress acting on the lower side of semiconductor chip 301 can be relaxed by first hole 303 in DTI region 302. The non-uniformity of thermal stress acting on semiconductor chip 301 can thus be reduced to reduce the strain of semiconductor chip 301. This prevents fluctuation in the characteristics of NPN bipolar transistor 301a and resistors included in the bandgap reference circuit. The same effects can also be achieved in the case where the element having the problem of fluctuation in characteristics is any of resistors 103, 104, and 105.

Hence, the circuit parameters do not deviate from the optimized characteristics, so that the deviation of reference voltage Vref of the bandgap reference circuit and the fluctuation of reference voltage Vref with temperature can be suppressed.

The inventors of the present disclosure have confirmed that the reduction of the non-uniformity of thermal stress applied to the upper and lower sides of semiconductor chip 301 can be easily achieved by making the film thickness of first conductive film 310 greater than the film thickness of active layer 311a in which DTI region 302 having first hole 303 is formed to thus make second hole 711 greater than first hole 303.

Regarding the stress by the surrounding package resin when semiconductor chip 301 is buried in the package, too, the stress acting on the upper side of semiconductor chip 301 can be relaxed by second hole 711, and the stress acting on the lower side of semiconductor chip 301 can be relaxed by first hole 303 in DTI region 302.

To reduce the strain in the region where NPN bipolar transistor 301a is formed, second hole 711 may be located outside NPN bipolar transistor 301a in plan view, and also may have a multiple structure.

As described above, in semiconductor device 300 according to this embodiment, first conductive film 310 has second hole 711 inside.

With such a structure, regarding the stress by the surrounding package resin when semiconductor chip 301 is packaged, the stress acting on the upper side of semiconductor chip 301 can be relaxed by second hole 711, and the stress acting on the lower side of semiconductor chip 301 can be relaxed by first hole 303 in DTI region 302. The strain in the element formation region of semiconductor chip 301 can be further reduced in this way.

First conductive film 310 may be formed to surround the whole of the formation region of the element in plan view, and second hole 711 may include at least one cavity formed in first conductive film 310 along a shape of first conductive film 310 in plan view, and surround the formation region of the element in plan view.

Second hole 711 may be a vacuum, or be filled with a gas or with a material lower in Young's modulus than active layer 311a.

Embodiment 4

Figure 8:
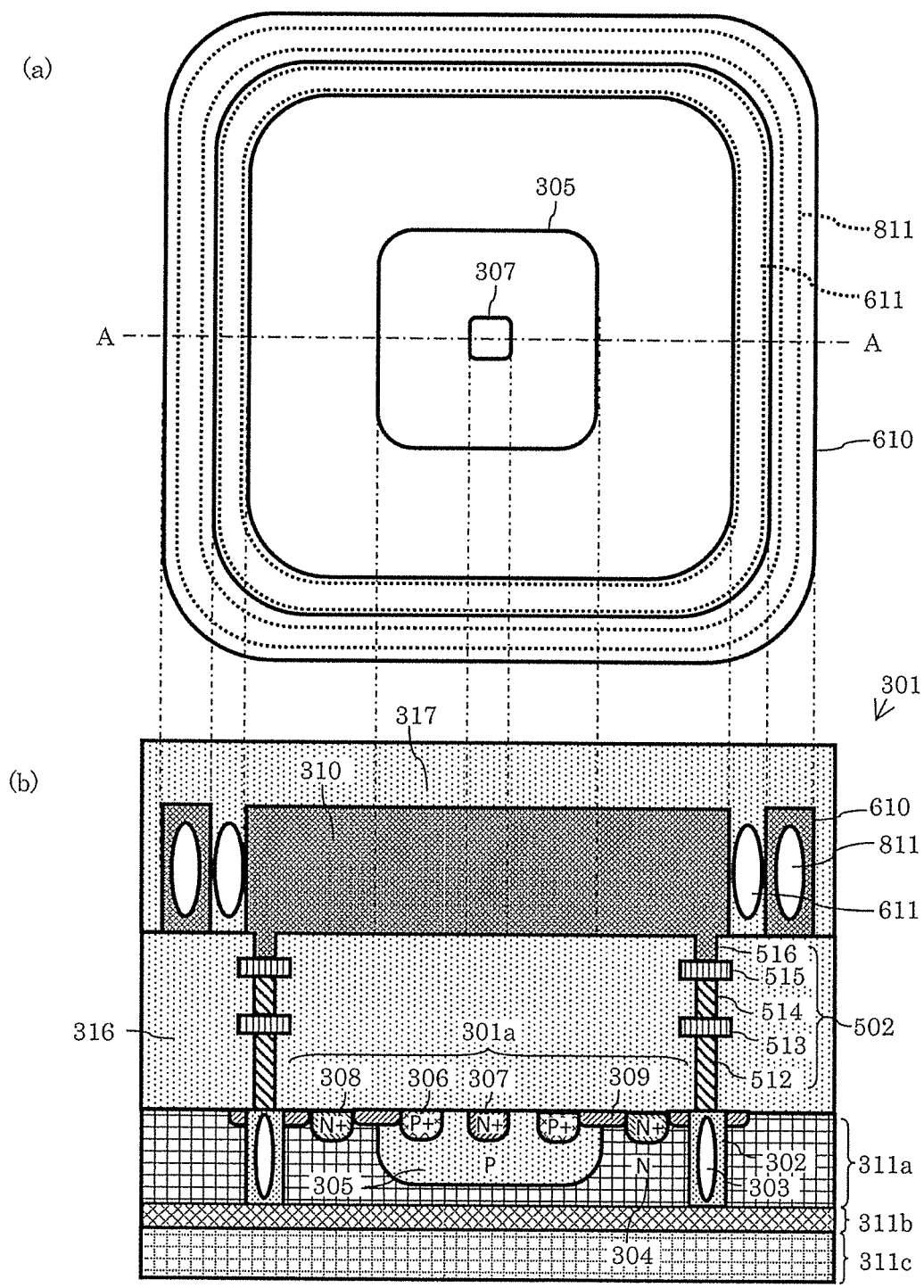
FIG. 8 is a perspective plan view and a sectional view illustrating a semiconductor chip included in a semiconductor device according to Embodiment 4.

FIG. 8 is a perspective plan view and a sectional view illustrating semiconductor chip 301 included in semiconductor device 300 according to Embodiment 4.

(a) in FIG. 8 is a perspective plan view of part of semiconductor chip 301. (b) in FIG. 8 is a sectional view along line A-A in (a) in FIG. 8.

Semiconductor chip 301 in FIG. 8 differs from that in FIG. 6 in the shape of first conductive film 310 and the addition of third hole 811 in second conductive film 610. The differences are mainly described below.

First conductive film 310 has a shape that covers at least the whole formation region of the element in plan view.

Second conductive film 610 has third hole 811 inside. Third hole 811 includes at least one cavity formed in second conductive film 610 along the shape of second conductive film 610 in plan view, and surrounds second conductive film 610 in plan view.

In this embodiment, the effects of the foregoing three embodiments can all be achieved.

As described above, in semiconductor device 300 according to this embodiment, second conductive film 610 has third hole 811 inside.

With such a structure, regarding the stress by the surrounding package resin when semiconductor chip 301 is packaged, the stress acting on the upper side of semiconductor chip 301 can be relaxed by second hole 711 and third hole 811, and the stress acting on the lower side of semiconductor chip 301 can be relaxed by first hole 303 in DTI region 302. The strain in the element formation region of semiconductor chip 301 can be further reduced in this way.

Third hole 811 may include at least one cavity formed in second conductive film 610 along a shape of second conductive film 610 in plan view, and surround second hole 611 in plan view.

Third hole 811 may be a vacuum, or be filled with a gas or with a material lower in Young's modulus than active layer 311a.

A method of manufacturing semiconductor device 300 is described below, using semiconductor device 300 in Embodiment 4 as an example.

The structure of semiconductor device 300 in Embodiment 4 covers approximately all of the structures of the semiconductor devices in the respective embodiments. Accordingly, the manufacturing method corresponding to each embodiment can be performed by appropriately omitting manufacturing steps of unnecessary structural elements from the following description of this embodiment.

(a) to (s) in FIGS. 9A to 9F are sectional views illustrating steps in the method of manufacturing semiconductor device 300 in FIG. 8.

Figure 9A:
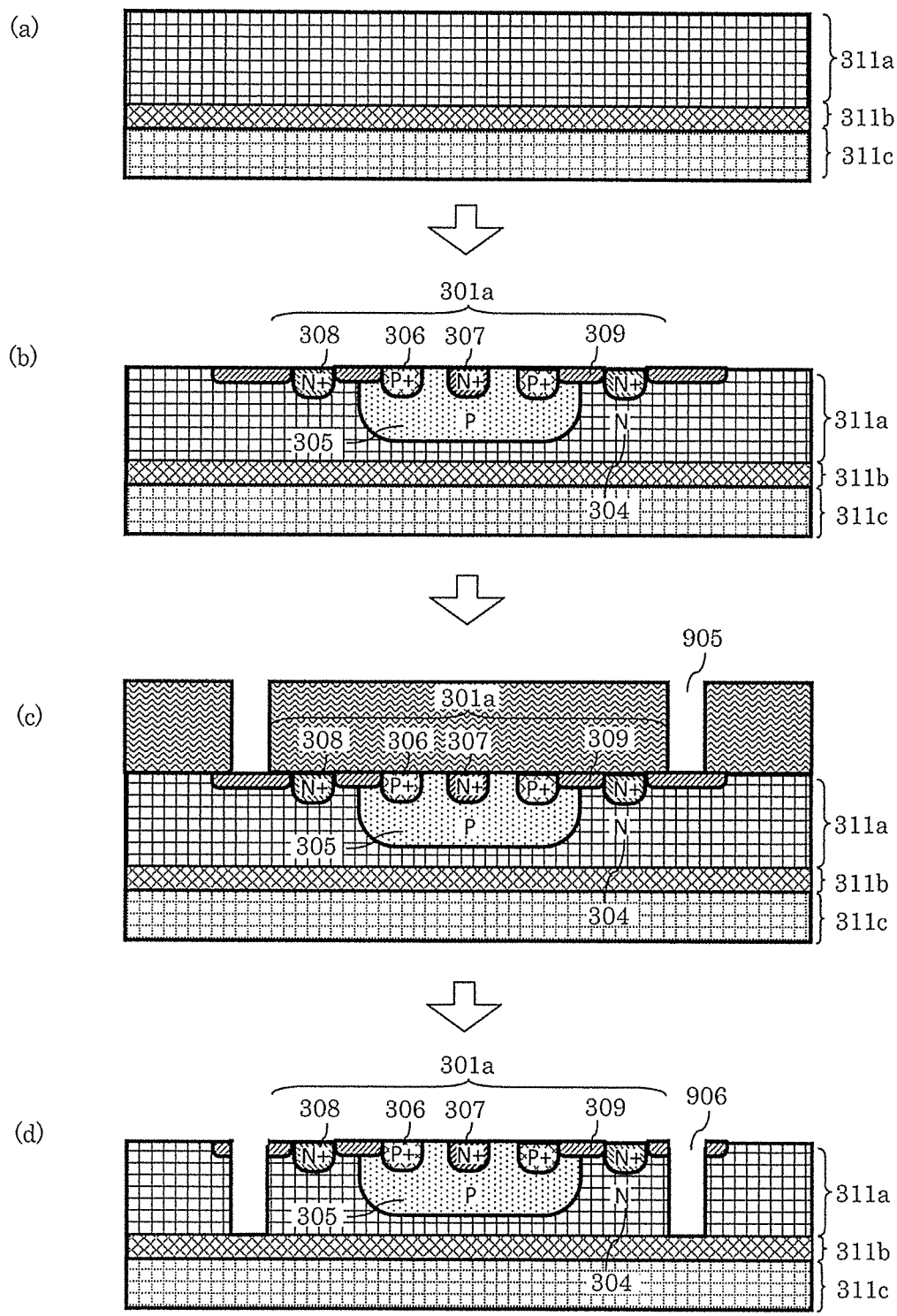
FIG. 9A is a sectional view illustrating steps (a) to (d) in a method of manufacturing the semiconductor chip included in the semiconductor device according to Embodiment 4.

First, an SOI substrate having buried insulation layer 311b between support substrate 311c and active layer 311a is prepared, as illustrated in (a) in FIG. 9A. The film thickness of active layer 311a may be, for example, about 1 μm to 10 μm.

Next, NPN bipolar transistor 301a is formed in an upper part of active layer 311a using, for example, a photolithographic technique or an ion implantation technique, as illustrated in (b) in FIG. 9A.

Next, a photoresist in which opening groove 905 is patterned is formed in a predetermined region surrounding whole NPN bipolar transistor 301a in plan view using, for example, a photolithographic technique, as illustrated in (c) in FIG. 9A. Although opening groove 905 is formed directly above the formation region of the STI surrounding whole NPN bipolar transistor 301a in this example, the position of opening groove 905 is not limited to be directly above the STI.

Next, groove portion 906 reaching buried insulation layer 311b below active layer 311a is formed in a predetermined region of active layer 311a using, for example, an etching technique, as illustrated in (d) in FIG. 9A. In detail, groove portion 906 is formed by, using a photoresist formed in the predetermined region by a photolithographic method as a mask, removing active layer 311a by a dry etching method until buried insulation layer 311b is exposed. Groove portion 906 has a shape that surrounds the whole element (NPN bipolar transistor 301a in this example). The width of groove portion 906 may be, for example, 0.3 μm to 1.0 μm. Groove portion 906 reaching buried insulation layer 311b may be formed by forming an insulation film on active layer 311a beforehand, removing a predetermined region of the insulation film using, for example, a photolithographic method and a dry etching method, and removing active layer 311a using the remaining insulation film as a hard mask for dry etching.

Figure 9B:
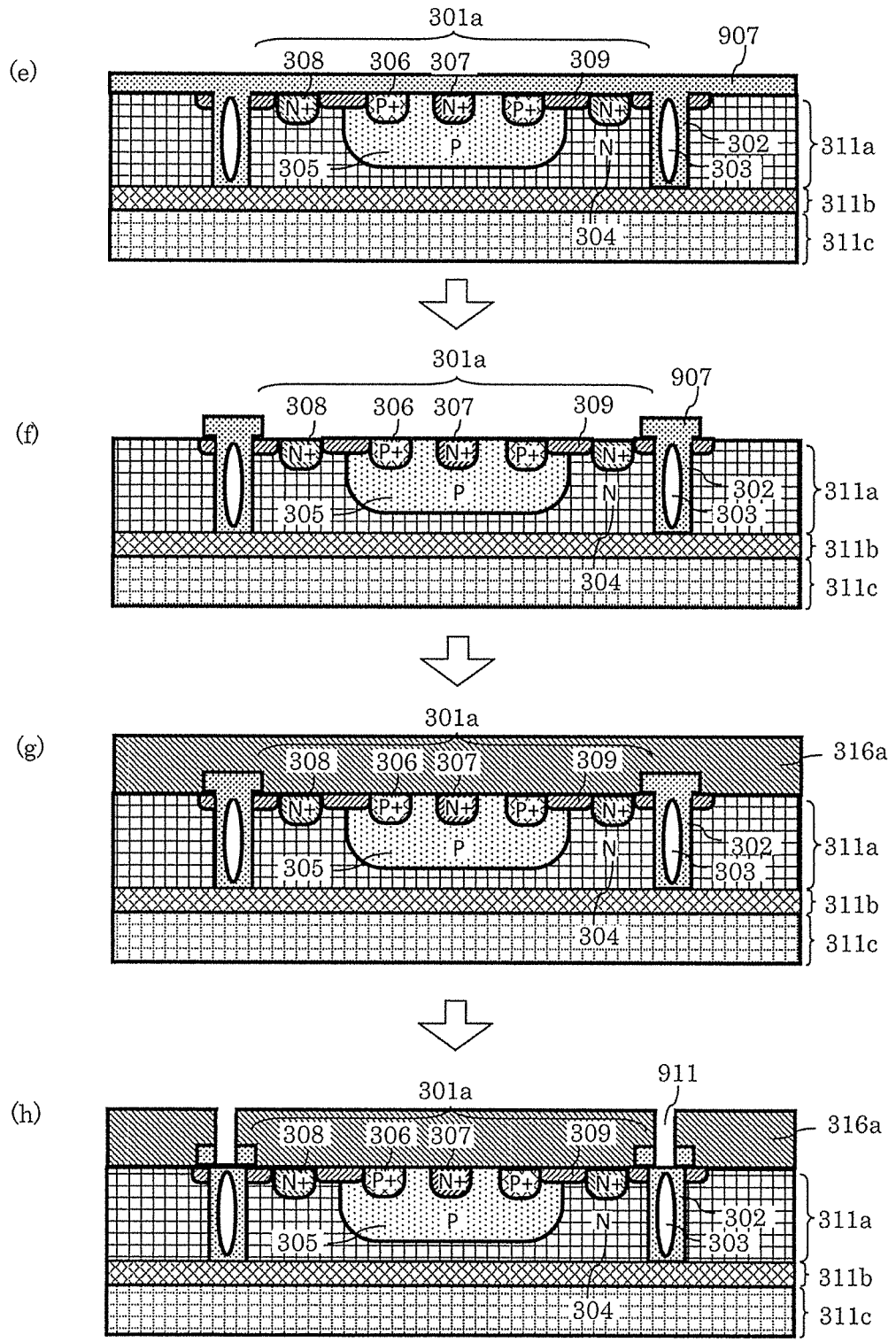
FIG. 9B is a sectional view illustrating steps (e) to (h) in the method of manufacturing the semiconductor chip included in the semiconductor device according to Embodiment 4.

Next, first insulation film 907 is formed on active layer 311a to fill groove portion 906 using, for example, a CVD method, as illustrated in (e) in FIG. 9B. Here, by setting the width of groove portion 906 to be narrow beforehand, the upper part of groove portion 906 can be blocked by first insulation film 907 before groove portion 906 is completely filled with first insulation film 907. As a result, an insulation oxide film having first hole 303 can be intentionally formed in groove portion 906. The insulation oxide film forms DTI region 302. The insulation oxide film (i.e. DTI region 302) having first hole 303 can also be intentionally formed in groove portion 906 by forming first insulation film 907 under a film formation condition of poor coverage. First hole 303 may be a vacuum, or be filled with a gas or with a material that has a different composition from the semiconductor substrate and is lower in Young's modulus than the semiconductor substrate.

As another method, after thermally oxidizing the silicon forming active layer 311a exposed in groove portion 906 to form an insulation film along the inner wall of groove portion 906, groove portion 906 may be filled with a conductive film using, for example, a CVD method or a puttering method. In this case, too, by setting the width of groove portion 906 to be narrow beforehand, the upper part of groove portion 906 can be blocked by the conductive film before groove portion 906 is completely filled with the conductive film. As a result, first hole 303 can be intentionally formed in groove portion 906. First hole 303 can also be intentionally formed in groove portion 906 by forming the conductive film under a film formation condition of poor coverage.

Next, first insulation film 907 in the predetermined region of active layer 311a is removed using, for example, a photolithographic method and an etching method so that the surface of active layer 311a, is exposed, to form DTI region 302 which is the insulation oxide film having first hole 303 in groove portion 906, as illustrated in (f) in FIG. 9B. Hence, the lower part of the NPN bipolar transistor is covered with buried insulation layer 311b and the whole lateral part of the NPN bipolar transistor is covered with DTI region 302 which is the insulation oxide film, so that the NPN bipolar transistor is electrically separated completely from support substrate 311c and other elements formed in the external surroundings. The predetermined region is a region other than the region covering groove portion 906. This leaves thin first insulation film 907 directly above DTI region 302.

Next, an insulation film is formed to cover the whole upper part of active layer 311a using, for example, a CVD method, and then the insulation film is polished using, for example, a CMP method to planarize its surface, thus forming interlayer insulation film 316a, as illustrated in (g) in FIG. 9B.

Next, opening 911 in groove shape passing through interlayer insulation film 316a is formed to surround NPN bipolar transistor 301a using, for example, a photolithographic method and a dry etching method, as illustrated in (h) in FIG. 9B. Opening 911 is a groove that is continuous in the horizontal direction and surrounds the whole formation region of NPN bipolar transistor 301a in plan view.

Figure 9C:
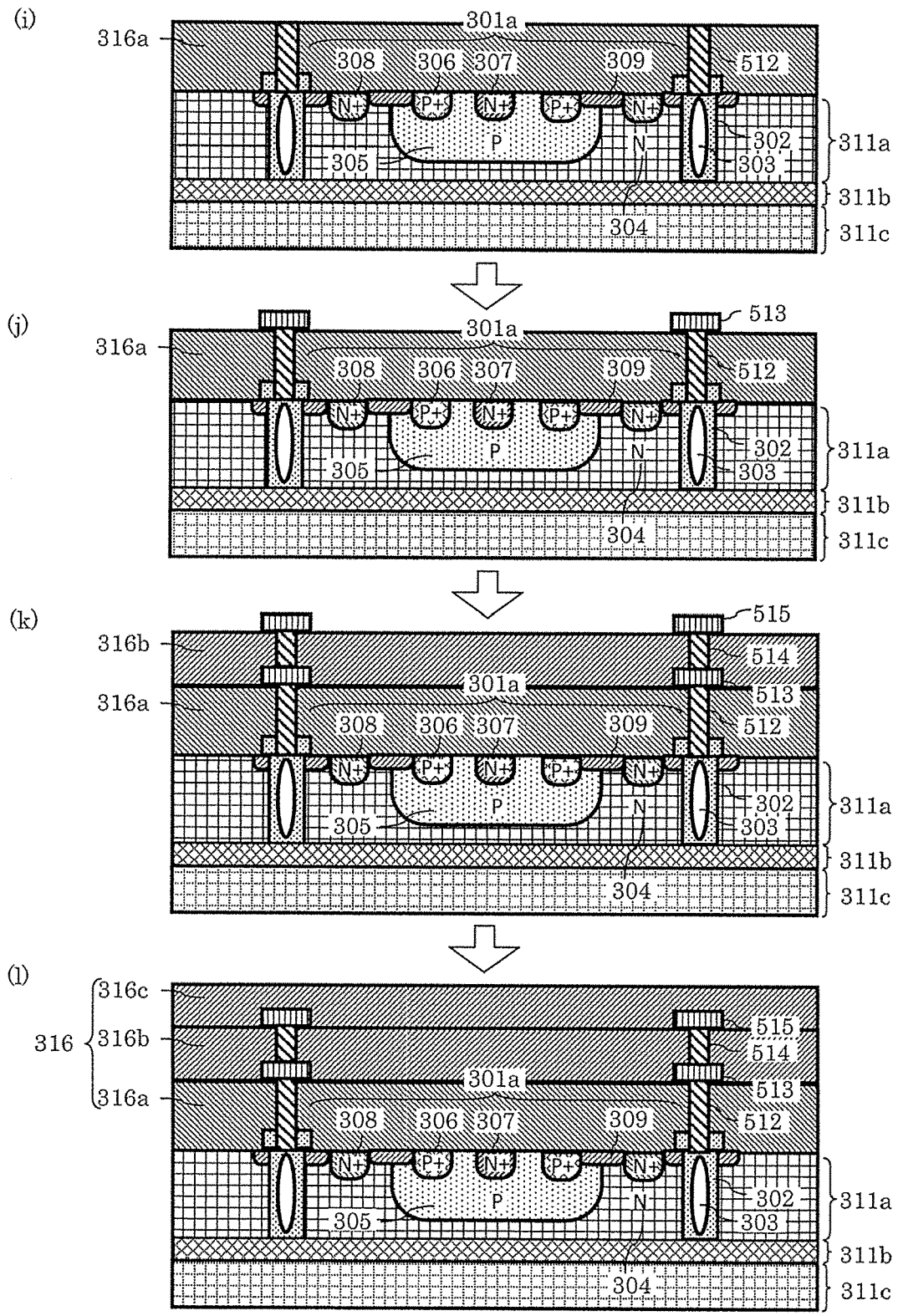
FIG. 9C is a sectional view illustrating steps (i) to (l) in the method of manufacturing the semiconductor chip included in the semiconductor device according to Embodiment 4.

Next, a conductive film made of a tungsten film as an example is formed on interlayer insulation film 316a while filling opening 911 using, for example, a CVD method or a sputtering method, and then the conductive film other than that in opening 911 is removed using, for example, a CMP method and a dry etching method, as illustrated in (i) in FIG. 9C. Connection conductive film 512 having the conductive film buried in opening 911 is thus formed. Connection conductive film 512 may be form together with the contact plug connecting the predetermined region of active layer 311a and the wiring of the upper wiring layer, with it being possible to avoid increases in manufacturing steps and manufacturing costs.

Next, a conductive film made of an aluminum film as an example is formed to cover connection conductive film 512 exposed to the surface of interlayer insulation film 316a, and then the unnecessary part of the conductive film is removed using, for example, a photolithographic method and a dry etching method to form wiring 513 to surround NPN bipolar transistor 301a in plan view, as illustrated in (j) in FIG. 9C. Wiring 513 may be formed together with other wiring of wiring layers, with it being possible to avoid increases in manufacturing steps and manufacturing costs.

Next, an insulation film is formed on interlayer insulation film 316a to cover wiring 513 using, for example, a CVD method, and then the insulation film is polished using, for example, a CMP method to planarize its surface, thus forming interlayer insulation film 316b, as illustrated in (k) in FIG. 9C. Following this, an opening that passes through interlayer insulation film 316b and reaches wiring 513 is formed using, for example, a photolithographic method and a dry etching method.

Next, a conductive film made of a tungsten film as an example is formed on interlayer insulation film 316b while filling the opening using, for example, a CVD method or a sputtering method, and then the conductive film other than that in the opening is removed using, for example, a CMP method and a dry etching method. Connection conductive film 514 having the conductive film buried in the opening is thus formed. Connection conductive film 514 may be form together with the contact plug connecting the wiring of the lower layer and the wiring of the upper layer, with it being possible to avoid increases in manufacturing steps and manufacturing costs.

Next, a conductive film made of an aluminum film as an example is formed to cover connection conductive film 514 exposed to the surface of interlayer insulation film 316b, and then the unnecessary part of the conductive film is removed using, for example, a photolithographic method and a dry etching method to form wiring 515 to surround NPN bipolar transistor 301a in plan view. Wiring 515 may be formed together with other wiring, with it being possible to avoid increases in manufacturing steps and manufacturing costs.

Next, an insulation film is formed on interlayer insulation film 316b to cover wiring 515 using, for example, a CVD method, and then the insulation film is polished using, for example, a CMP method to planarize its surface, thus forming interlayer insulation film 316c, as illustrated in (l) in FIG. 9C.

Figure 9D:
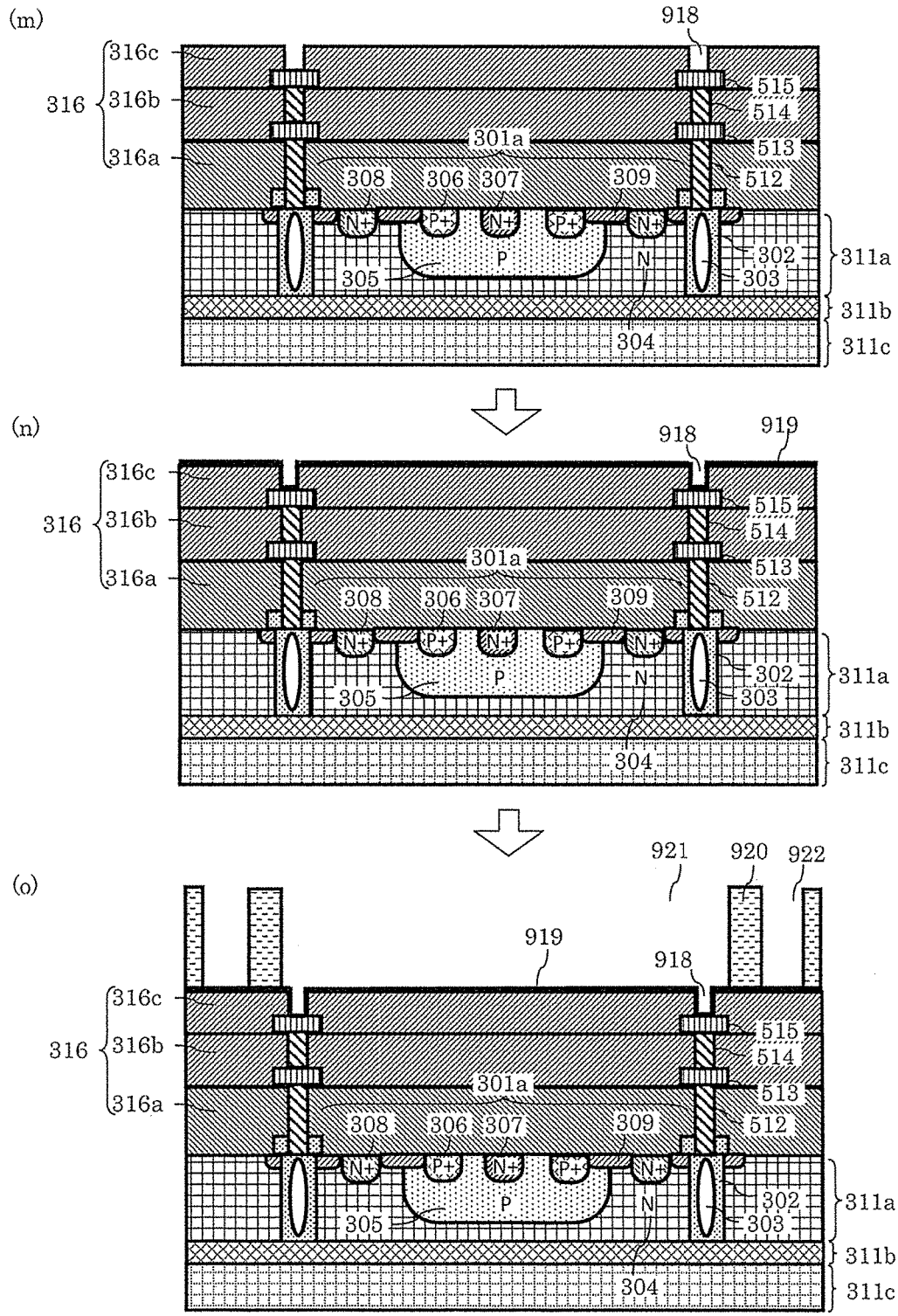
FIG. 9D is a sectional view illustrating steps (m) to (o) in the method of manufacturing the semiconductor chip included in the semiconductor device according to Embodiment 4.

Next, opening 918 that passes through interlayer insulation film 316c and reaches wiring 515 is formed using, for example, a photolithographic method and a dry etching method, as illustrated in (m) in FIG. 9D.

Next, conductive film 919 made of Cu, Ti, or Ta or a compound containing any of these elements, which serves as a coating seed film, is formed on the inner wall and the bottom of opening 918 and on interlayer insulation film 316c using, for example, a sputtering method, as illustrated in (n) in FIG. 9D.

Next, a photoresist is applied onto conductive film 919, and the resist in the region where thick film wiring is formed is removed using, for example, a lithographic method, to form resist pattern 920, as illustrated in (o) in FIG. 9D. Resist pattern 920 forms first opening 921 in the whole region directly above NPN bipolar transistor 301a including opening 918 in plan view, and also forms second opening 922 on the outer side of and away from first opening 921 to surround first opening 921.

Figure 9E:
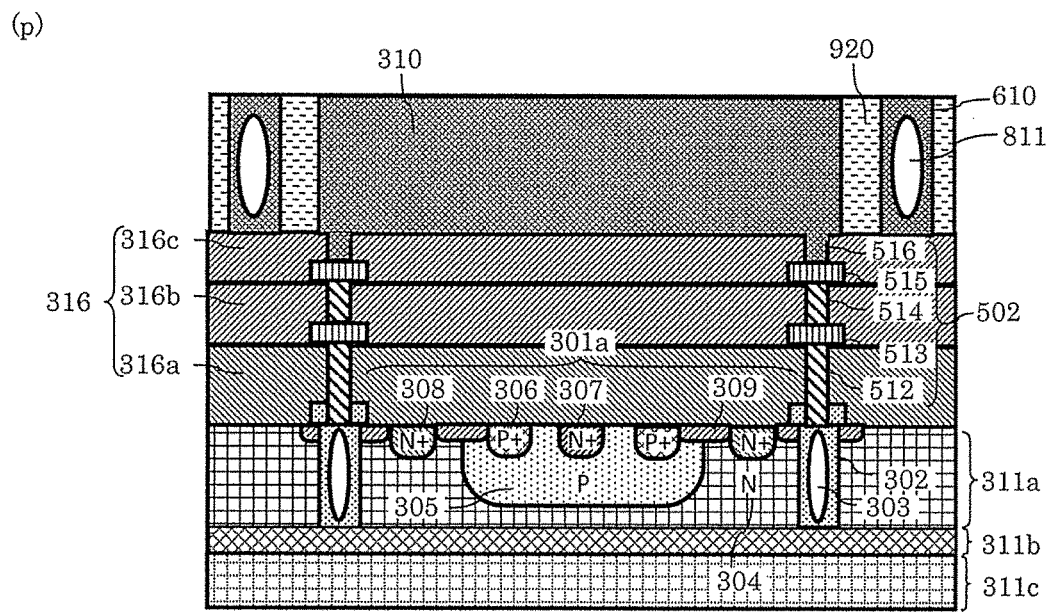
FIG. 9E is a sectional view illustrating steps (p) and (q) in the method of manufacturing the semiconductor chip included in the semiconductor device according to Embodiment 4.
Figure 9E:
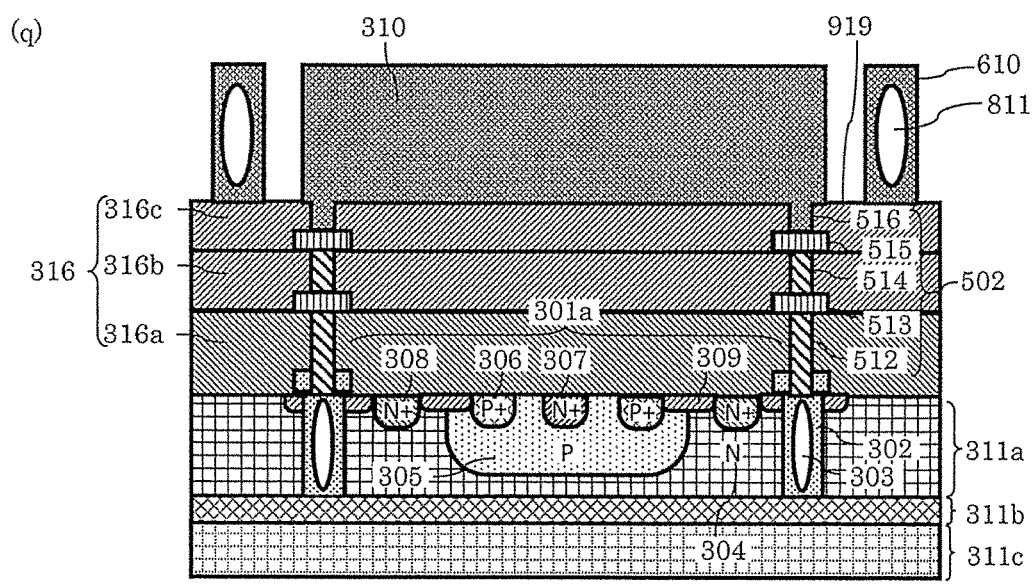

Next, thick first conductive film 310 is grown in first opening 921 and thick second conductive film 610 is grown in second opening 922 on conductive film 919 as the seed using an electroplating method, as illustrated in (p) in FIG. 9E.

The film thickness of first conductive film 310 and second conductive film 610 is made greater than the film thickness of active layer 311a by adjusting the coating time. For example, the film thickness of first conductive film 310 and second conductive film 610 is 3 µm to 30 µm. Here, by setting the width of second opening 922 to be narrow beforehand, third hole 811 can be intentionally formed in second conductive film 610 as thick film wiring. Third hole 811 can be also intentionally formed by changing the coating growth condition. Third hole 811 may be a vacuum, or be filled with a gas or with a material that has a different composition from the semiconductor substrate and is lower in Young's modulus than the semiconductor substrate.

Next, the photoresist forming resist pattern 920 is removed by ashing and cleaning, to form second conductive film 610 including first conductive film 310 and third hole 811, as illustrated in (q) in FIG. 9E.

Next, conductive film 919 which is an unwanted seed film remaining on the surface is removed using, for example, an etching method, as illustrated in (r) in FIG. 9E.

Figure 9F:
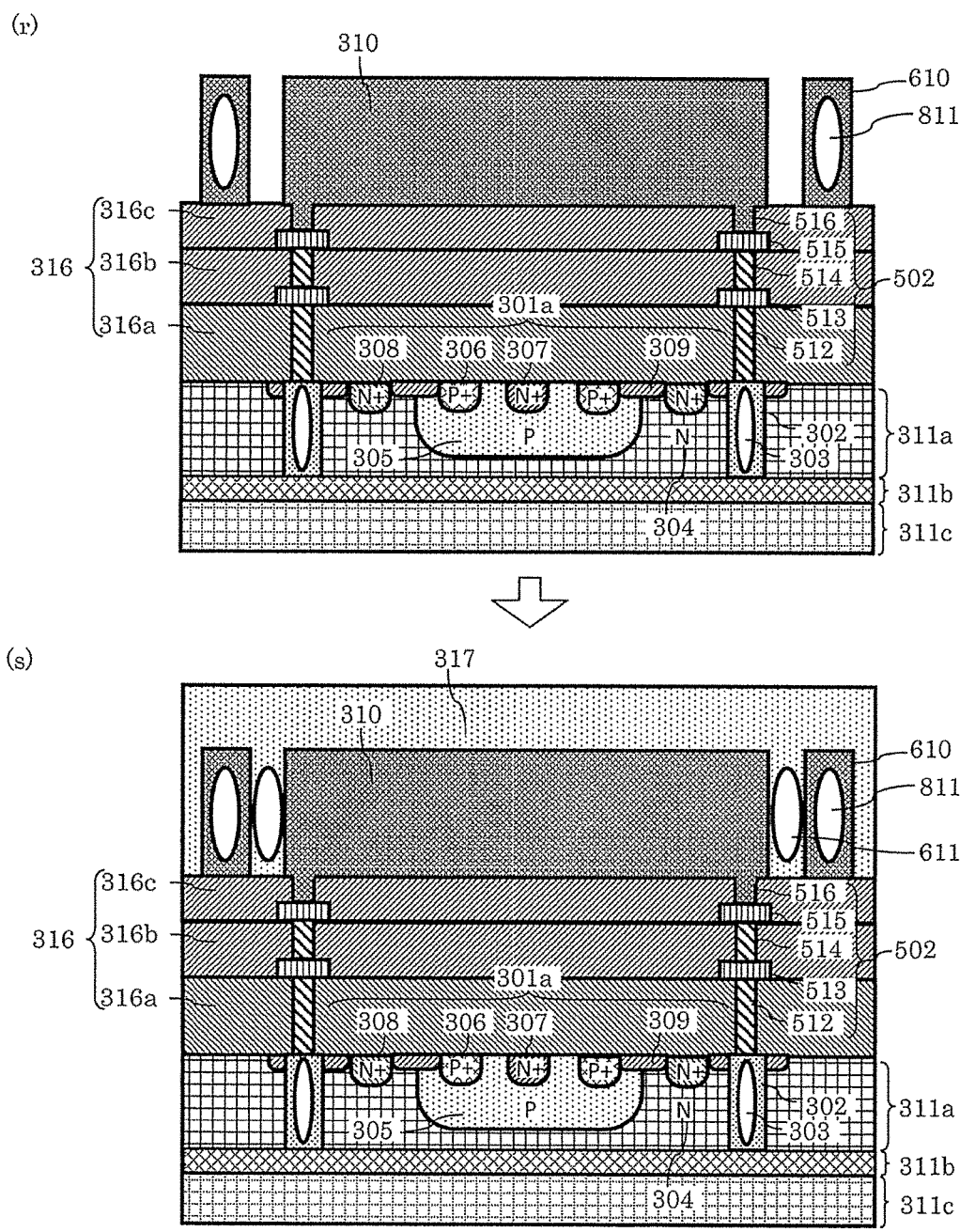
FIG. 9F is a sectional view illustrating steps (r) and (s) in the method of manufacturing the semiconductor chip included in the semiconductor device according to Embodiment 4.

Next, protection film 317 made of an insulation film such as an oxide film or a nitride film or a resin film such as polyimide is formed on interlayer insulation film 316c including first conductive film 310 and second conductive film 610 as thick film wiring using, for example, a CVD method, as illustrated in (s) in FIG. 9F. Here, by setting the width between first conductive film 310 and second conductive film 610 to be narrow beforehand, second hole 611 can be easily formed between first conductive film 310 and second conductive film 610. Second hole 611 can also be easily formed by using a film formation condition of poor coverage in the formation of protection film 317. Second hole 611 may be a vacuum, or be filled with a gas or with a material that has a different composition from the semiconductor substrate and is lower in Young's modulus than the semiconductor substrate.

As described above, the method of manufacturing semiconductor device 300 according to this embodiment is a method of manufacturing semiconductor device 300 including: semiconductor chip 301 that has a silicon on insulator (SOI) substrate carrying a circuit; and resin mold 406 that coats semiconductor chip 301, the method including: preparing the SOI substrate including an active layer and a buried insulation layer ((a) in FIG. 9A); forming an element included in the circuit, in the active layer ((b) in FIG. 9A); forming a groove that passes through the active layer to surround a whole formation region of the element ((d) in FIG. 9A); forming a first insulation film on the active layer and, before the groove portion is completely filled with the first insulation film, blocking the groove portion to form a first hole in the groove portion ((e) in FIG. 9B); and forming a first conductive layer greater in film thickness than the active layer, above the active layer ((p) in FIG. 9E).

Although the foregoing embodiments describe a structure using bipolar transistors and resistors as a reference voltage generation circuit, the structure according to the present disclosure is also effective in the case where an analog circuit is required to have high accuracy or the difference between circuits is required to be equal, e.g. a reference voltage generation circuit using zener diodes.

In all embodiments, examples of the element for which the present disclosure is particularly effective include a transistor, a diode, a resistor, an analog circuit, a reference voltage generation circuit, a current mirror circuit, a differential amplifier, and a combination thereof.

While the semiconductor device and the method of manufacturing the semiconductor device according to a plurality of aspects have been described above by way of embodiments, the present disclosure is not limited to such embodiments. Other modifications obtained by applying various changes conceivable by a person skilled in the art to the embodiments and any combinations of the structural elements in different embodiments without departing from the scope of the present disclosure are also included in the scope of one or more aspects.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The semiconductor device according to the present disclosure is particularly useful for a wide variety of products such as electric vehicles, hybrid vehicles, mobile devices, and meter devices that require battery measurement or sensor measurement.

What is claimed is:

1. A semiconductor device including: a semiconductor chip that has a silicon on insulator (SOI) substrate carrying a circuit; and a resin mold that seals the semiconductor chip, the semiconductor device comprising:
    an active layer that is located in the SOI substrate, and in which an element included in the circuit is formed;
    a buried insulation layer that is located in the SOI substrate, and is in contact with the active layer;
    a deep trench isolation (DTI) region that is formed in the active layer to surround a whole of a formation region of the element in plan view, and extends from a surface of the active layer to the buried insulation layer;
    a first conductive film formed above the element;
    a first interlayer insulation film formed between the active layer and the first conductive film; and
    a support structure made of a conductive film that passes through the first interlayer insulation film and is in contact with the active layer and the first conductive film,
    wherein the DTI region has a first hole inside,
    a film thickness of the first conductive film is greater than a thickness of the active layer, and
    the support structure made of the conductive film is in contact with the DTI region, and surrounds a whole of the element in plan view.

2. The semiconductor device according to claim 1, wherein the first hole includes at least one cavity formed in the DTI region along a shape of the DTI region in plan view, and surrounds the formation region of the element in plan view.

3. The semiconductor device according to claim 1, wherein the first conductive film has a shape covering at least the whole of the formation region of the element in plan view, or a shape surrounding the whole of the formation region of the element in plan view.

4. The semiconductor device according to claim 1, wherein a first insulation film that fills inside of the DTI region is not formed on the formation region of the element.

5. The semiconductor device according to claim 1, wherein the support structure made of the conductive film includes: two or more layers of wiring formed in the first interlayer insulation film; and a conductive film connecting the two or more layers of wiring to each other.

6. The semiconductor device according to claim 1, wherein an area of the first conductive film is greater than or equal to an area of the support structure made of the conductive film, in plan view.

7. The semiconductor device according to claim 1, wherein the first hole is a vacuum, or is filled with a gas or with a material lower in Young's modulus than the active layer.

8. A semiconductor device including: a semiconductor chip that has a silicon on insulator (SOI) substrate carrying a circuit; and a resin mold that seals the semiconductor chip, the semiconductor device comprising:
    an active layer that is located in the SOI substrate, and in which an element included in the circuit is formed;
    a buried insulation layer that is located in the SOI substrate, and is in contact with the active layer;
    a deep trench isolation (DTI) region that is formed in the active layer to surround a whole of a formation region of the element in plan view, and extends from a surface of the active layer to the buried insulation layer; and a first conductive film formed above the element,
a second conductive film formed in a same layer as the first conductive film, to surround a whole of the first conductive film in plan view; and
a protection film filling a gap between the first conductive film and the second conductive film,
wherein the DTI region has a first hole inside,
a film thickness of the first conductive film is greater than a thickness of the active layer, and
the protection film has a second hole between the first conductive film and the second conductive film.

9. The semiconductor device according to claim 8, wherein the second conductive film has a third hole inside.

10. The semiconductor device according to claim 9, wherein the third hole includes at least one cavity formed in the second conductive film along a shape of the second conductive film in plan view, and surrounds the second hole in plan view.

11. The semiconductor device according to claim 9, wherein the third hole is a vacuum, or is filled with a gas or with a material lower in Young's modulus than the active layer.

12. The semiconductor device according to claim 8, wherein the second hole includes at least one cavity formed between the first conductive film and the second conductive film along an outer shape of the first conductive film in plan view, and surrounds the first conductive film in plan view.

13. The semiconductor device according to claim 8, wherein a vertical dimension of the second hole is greater than a vertical dimension of the first hole in side view.

14. The semiconductor device according to claim 8, wherein the first conductive film is formed to surround the whole of the formation region of the element in plan view.

15. The semiconductor device according to claim 8, wherein the second hole is a vacuum, or is filled with a gas or with a material lower in Young's modulus than the active layer.

16. A semiconductor device including: a semiconductor chip that has a silicon on insulator (SOI) substrate carrying a circuit; and a resin mold that seals the semiconductor chip, the semiconductor device comprising:
an active layer that is located in the SOI substrate, and in which an element included in the circuit is formed;
a buried insulation layer that is located in the SOI substrate, and is in contact with the active layer;
a deep trench isolation (DTI) region that is formed in the active layer to surround a whole of a formation region of the element in plan view, and extends from a surface of the active layer to the buried insulation layer;
a first conductive film formed above the element; and
a second conductive film formed in a same layer as the first conductive film, above the element,
wherein the DTI region has a first hole inside,
a film thickness of the first conductive film is greater than a thickness of the active layer, and
a film thickness of the second conductive film is greater than the thickness of the active layer.

17. The semiconductor device according to claim 16, further comprising:
a protection film filling a gap between the first conductive film and the second conductive film,
wherein the protection film has a second hole between the first conductive film and the second conductive film, and
a vertical dimension of the second hole is greater than a vertical dimension of the first hole in side view.

18. The semiconductor device according to claim 17, wherein the second hole is a vacuum, or is filled with a gas or with a material lower in Young's modulus than the active layer.

19. A semiconductor device including: a semiconductor chip that has a silicon on insulator (SOI) substrate carrying a circuit; and a resin mold that seals the semiconductor chip, the semiconductor device comprising:
an active layer that is located in the SOI substrate, and in which an element included in the circuit is formed;
a buried insulation layer that is located in the SOI substrate, and is in contact with the active layer;
a deep trench isolation (DTI) region that is formed in the active layer to surround a whole of a formation region of the element in plan view, and extends from a surface of the active layer to the buried insulation layer; and
a first conductive film formed above the element,
wherein the DTI region has a first hole inside,
a film thickness of the first conductive film is greater than a thickness of the active layer, and
the first conductive film has a second hole inside.

20. The semiconductor device according to claim 19, wherein the first conductive film is formed to surround the whole of the formation region of the element in plan view, and
the second hole includes at least one cavity formed in the first conductive film along a shape of the first conductive film in plan view, and surrounds the formation region of the element in plan view.

21. The semiconductor device according to claim 19, wherein the second hole is a vacuum, or is filled with a gas or with a material lower in Young's modulus than the active layer.

* * * * *